United States Patent [19]
Takaishi

[11] Patent Number: 5,801,079
[45] Date of Patent: Sep. 1, 1998

[54] METHOD FOR MANUFACTURING A STACKED CAPACITOR TYPE SEMICONDUCTOR MEMORY DEVICE WITH GOOD FLATNESS CHARACTERISTICS

[75] Inventor: Yoshihiro Takaishi, Tokyo, Japan

[73] Assignee: NEC Corporation, Tokyo, Japan

[21] Appl. No.: 569,006

[22] Filed: Dec. 7, 1995

Related U.S. Application Data

[62] Division of Ser. No. 506,979, Jul. 28, 1995, Pat. No. 5,604,696.

[30] Foreign Application Priority Data

Jul. 29, 1994 [JP] Japan ..................... 6-177867

[51] Int. Cl.[6] ............................ H01L 21/20
[52] U.S. Cl. ............... 438/396; 438/253; 148/DIG. 14
[58] Field of Search ........................ 438/396, 397, 438/398, 253, 254, 255; 148/DIG. 14

[56] References Cited

U.S. PATENT DOCUMENTS

| | | | |
|---|---|---|---|
| 5,162,881 | 11/1992 | Ohya | 257/309 |
| 5,217,914 | 6/1993 | Matsumoto et al. | 437/60 |
| 5,247,196 | 9/1993 | Kimura | 257/306 |
| 5,274,258 | 12/1993 | Ahn | 257/309 |
| 5,389,568 | 2/1995 | Yun | 438/396 |
| 5,401,681 | 3/1995 | Dennison | 438/396 |
| 5,418,180 | 5/1995 | Brown | 437/47 |
| 5,491,103 | 2/1996 | Ahn et al. | 437/919 |
| 5,508,222 | 4/1996 | Sakao | 437/47 |

Primary Examiner—Tuan H. Nguyen
Attorney, Agent, or Firm—Sughrue, Mion, Zinn, Macpeak & Seas, PLLC

[57] ABSTRACT

In a stacked capacitor type semiconductor device, first and second insulating layers are formed on a semiconductor substrate. A capacitor lower electrode layer is formed in an opening formed within the second insulating layer, and is electrically connected via a contact hole of the first insulating layer to an impurity doped region of the semiconductor substrate. A capacitor insulating layer is formed on the capacitor lower electrode layer, and a capacitor upper electrode layer is formed on the capacitor insulating layer.

9 Claims, 34 Drawing Sheets

5,801,079

METHOD FOR MANUFACTURING A STACKED CAPACITOR TYPE SEMICONDUCTOR MEMORY DEVICE WITH GOOD FLATNESS CHARACTERISTICS

This is a divisional of application Ser. No. 08/506,979 filed Jul. 28, 1995, now U.S. Pat. No. 5,604,696.

BACKGROUND OF THE INVENTION

1. Field of the Invention

The present invention relates to a stacked capacitor used in a memory cell of a dynamic random access memory (DRAM) device.

2. Description of the Related Art

Generally, in a DRAM device, each memory cell is constructed by a MOS transistor and a capacitor. A stacked capacitor, which has lower and upper electrodes and an insulating layer therebetween, has been used as such a capacitor. Since the stacked capacitor is three-dimensional, the capacitance thereof can be increased, to thereby enhance the integration of the DRAM device.

In a prior art stacked capacitor type DRAM device, an insulating layer is formed on a semiconductor substrate. A capacitor electrode layer is formed on the insulating layer and is electrically connected via a contact hole of the insulating layer to an impurity doped region of the semiconductor substrate. Also, a capacitor insulating layer is formed on the capacitor lower electrode layer, and a capacitor upper electrode layer is formed on the capacitor insulating layer. This will be explained later in detail.

In the above-described prior art stacked capacitor type DRAM device, however, a step between a memory cell array area and a peripheral circuit area is so large that it is difficult to arrange wiring patterns around an interface between the memory cell array area and the peripheral circuit area. Particularly, when the device is highly integrated, the depth of focus of an exposure system used in a lithography process is reduced, so that a fine pattern cannot be formed on such a step.

SUMMARY OF THE INVENTION

It is an object of the present invention to reduce a step between a memory cell array area for stacked capacitors and a peripheral circuit area in a DRAM device.

Another object is to provide a highly integrated stacked capacitor type semiconductor device.

According to the present invention, in a DRAM device, first and second insulating layers are formed on a memory cell array area and a peripheral circuit area of a semiconductor substrate. A plurality of openings are formed in the second insulating layer on the memory cell array area. Stacked capacitors are buried in the openings, and are electrically connected via contact holes of the first insulating layer to impurity doped regions of the semiconductor substrate.

Also, according to the present invention, in a DRAM device, first and second insulating layers are formed on a memory cell array area and a peripheral circuit area of a semiconductor substrate. A groove is formed in the second insulating layer, so that the second insulating layer in the memory cell array area is divided into a plurality of islands. Stacked capacitors are formed on the islands, and are electrically connected via contact holes of the second insulating layer and contact holes of the first insulating layer to impurity doped regions of the semiconductor substrate.

Thus, a step between the memory cell array area and the peripheral circuit area is reduced.

BRIEF DESCRIPTION OF THE DRAWINGS

The present invention will be more clearly understood from the description as set forth below, as compared with the prior art, with reference to the accompanying drawings, wherein:

FIG. 4A through 4I are cross-sectional views for explaining the manufacturing steps of the device of FIG. 2;

DESCRIPTION OF THE PREFERRED EMBODIMENTS

Before the description of the preferred embodiments, a prior art DRAM device will be explained with reference to FIG. 1.

Figure 1:
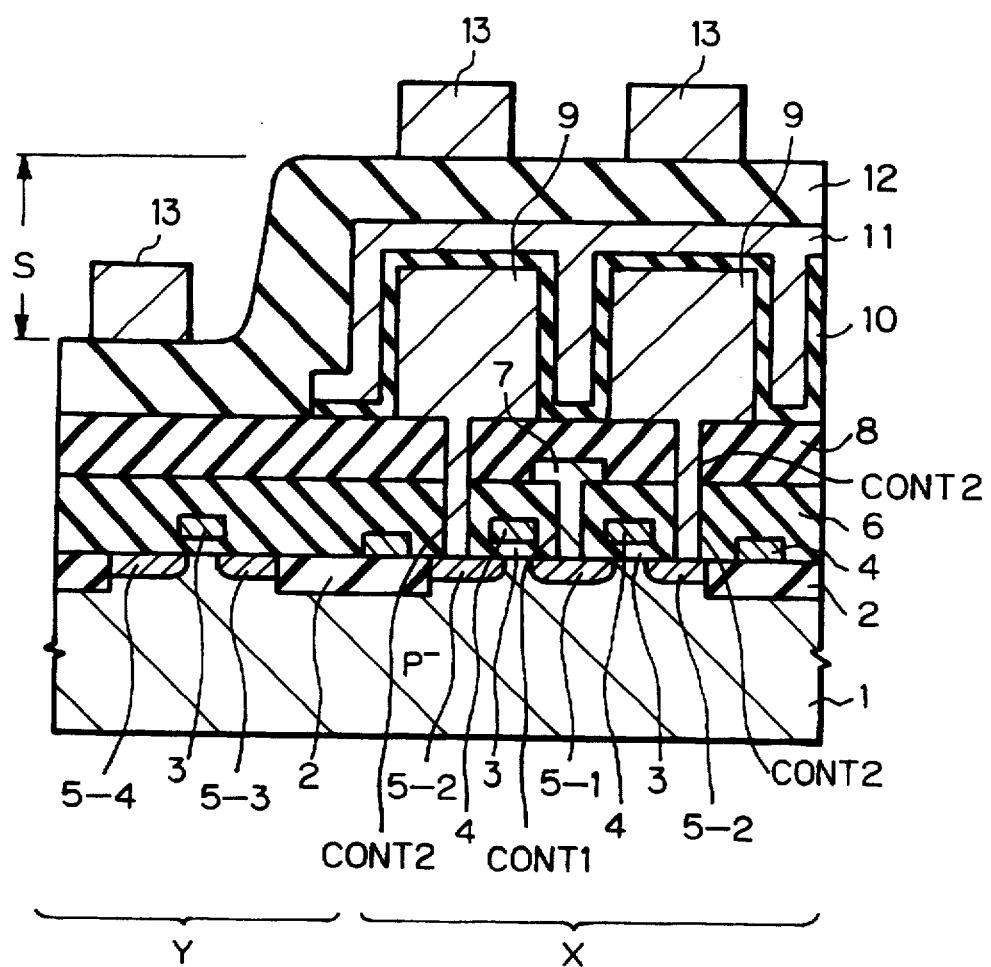
FIG. 1 is a cross-sectional view illustrating a prior art DRAM deice.

In FIG. 1, X designates a memory cell array area, and Y designates a peripheral circuit area for address buffers, address decoders sense amplifiers and the like. In a P$^-$-type monocrystalline silicon substrate 1, a thick field silicon oxide layer 2 is formed for isolating elements from eack other. Also, gate thin silicon oxide layers 3 and gate electrode layers 4 are formed thereon. Further, N$^+$-type impurity doped regions 5-1 through 5-5 are formed within the silicon substrate 1. Note that the region 5-1 is a drain region of a MOS transistor or so-called cell transistor, for connection of a bit line the region 5-2 is for a source region of the cell transistor, and the regions 5-3 and 5-4 are for source and drain regions of a transistor of the peripheral circuit area Y.

Also, a silicon oxide layer 6 is formed on the gate electrode layers 3, and is flattened by using a chemical mechanical polishing (CMP) process. A contact hole CONT1 is perforated in the silicon oxide layer 6, and a conductive layer 7 is deposited by a chemical vapor deposition (CVD) process thereon. In this case, the conductive layer 7 is also buried in the contact hole CONT1, and the conductive layer 7 is patterned to form one bit line. Note that the conductive layer 7 is made of phosphorus or arsenic including polycrystalline silicon or high melting temperature metal such as Ti and W.

Further, an insulating layer 8 is formed thereon. The insulating layers 6 and 8 are patterned to form contact holes CONT2 therein.

Also, capacitor lower electrode layers 9 are formed thereon, and are connected via the contact holes CONT2 to the impurity doped regions 5-2. Also, a capacitor insulating layer 10 and a capacitor upper electrode layer 11 which is called a cell plate made of laminated titanium nitride (TiN) and W are formed commonly for the memory cells.

Then, an insulting layer 12 is formed thereon, and first wiring layers 13 made of aluminum are formed by using a sputtering process. Finally, another insulating layer and second wiring layers (not shown) are formed.

In order to increase the capacitance of each stacked capacitor while enhancing the integration of the device as illustrated in FIG. 1, the height of the capacitor lower electrode layers 9 has to be increased, i.e., the aspect ratio of the capacitor lower electrode layers 9 has to be increased. For example, in a 256 Mbit DRAM device, an area per one memory cell is about 0.5 to 0.6 $\mu m^2$ and the capacitance thereof should be more than 30 fF in accordance with the memory cell reduction rule. Therefore, if the capacitor insulating layer 10 is equivalent to a 4 nm thick silicon oxide layer, the height of the capacitor lower eletrode layers 9 should be approximately 1 µm.

Thus, in the prior art DRAM device as illustrated in FIG. 1 applied to a 256 Mbit configuration, a step S between the memory cell array area X and the peripheral circuit area Y is so large, for example, 1 µm, that it is impossible to form the first wiring layers 13 and the second wiring layers around the interface between the memory cell array area X and the peripheral circuit area Y due to the reduced depth of focus of an exposure system used in a lithograply process.

Figure 2:
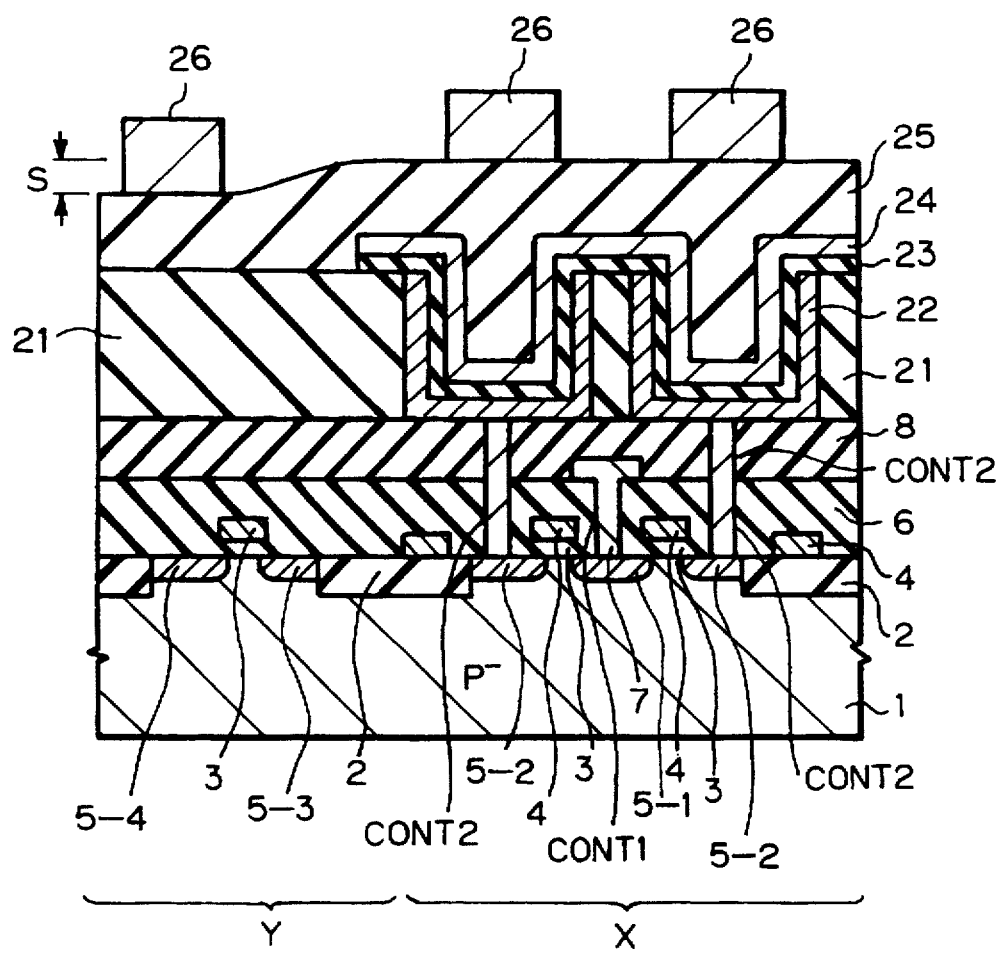
FIG. 2 is a cross-sectional view illustrating a first embodiment of the DRAM device according to the present invention.

In FIG. 2, which illustrates a first embodiment of the present invention, an about 500 to 1000 nm thick insulating layer 21 made of silicon oxide is formed on the insulating layer 8. A plurality of openings are perforated in the insulating layer 21, and stacked capacitors are buried in the openings, that is, a capacitor lower electrode layer 22 is formed within each of the openings. The capacitor lower electrode layer 22 is made of phosphorus or arsenic doped polycrystalline silicon or high melting temperature metal such as TiN. The capacitor lower electrode layer 22 is electrically connected via the contact hole CONT2 to the impurity doped region 5-2. Also, a capacitor insulating layer 23 and a capacitor upper electrode layer 24 made of laminated TiN and W are formed commonly for the memory cells.

Then, an insulating layer 25 is formed thereon, and first wiring layers 26 made of aluminum are formed by using a sputtering process. Finally, another insulating layer and second wiring layers (not shown) are formed.

Thus, in the first embodiment as illustrated in FIG. 2, a step S between the memory cell array area X and the peripheral circuit area Y is remarkably reduced. Note that the step S depends mainly upon the thickness of the capacitor upper electrode layer 24 which is less than 200 nm thick.

Figure 3:
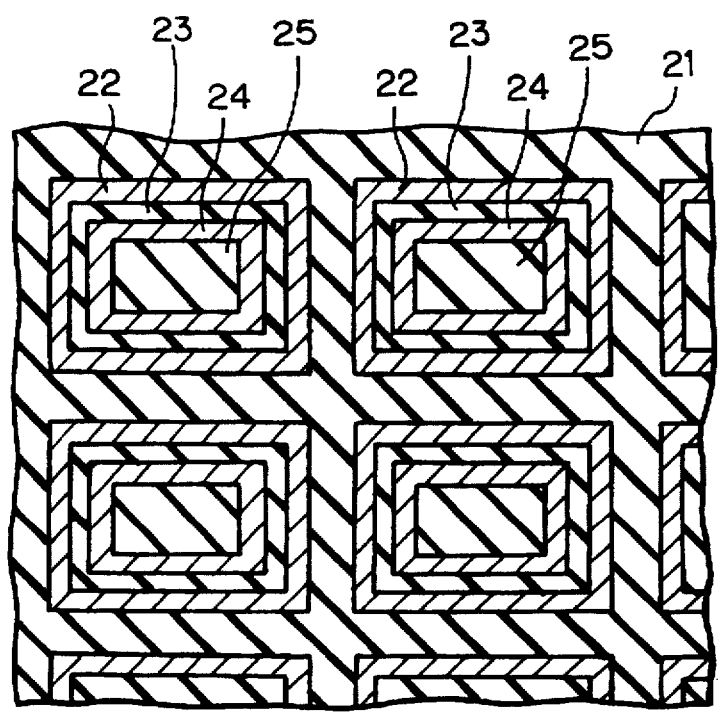
FIG. 3 is a traverse cross-sectional view of the capacitor lower electrode layer and the capacitor upper electrode layer of FIG. 2.

In FIG. 3, which is a traverse cross-sectional view of the capacitor lower electrode layer 22 and the capacitor upper electrode layer 24 taken along the line at the middle of the openings of the insulating layer 21 of FIG. 2, a stacked capacitor is formed by the capacitor lower electrode layer 22, the capacitor upper electrode layer 24, and the capacitor insulating layer 23 therebetween, which are located within the opening of the insulating layer 21.

The manufacture of the device of FIG. 2 is explained next with reference to FIGS. 4A through 4I.

Figure 4A:
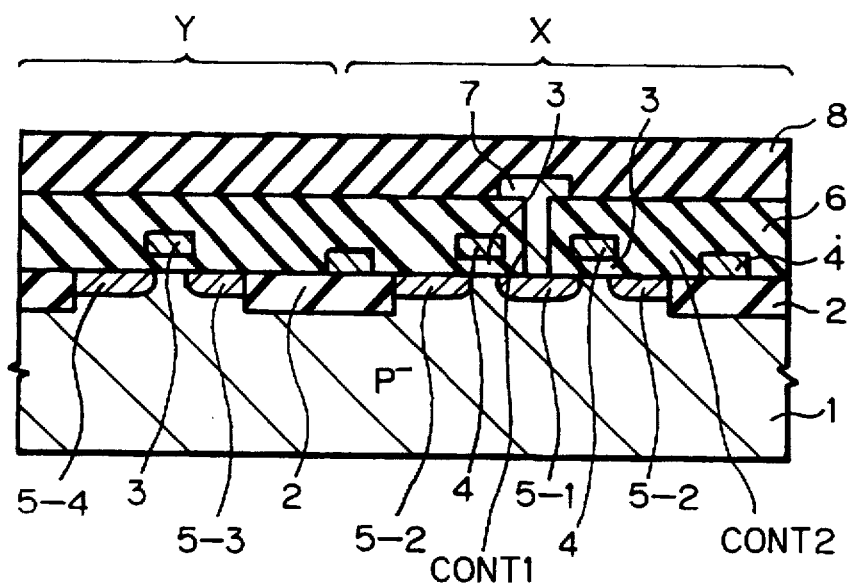

First, referring to FIG. 4A, a thick field silicon oxide layer 2 is formed by using a local oxidation of silicon (LOCOS) process in a $P^-$-type monocrystalline silicon substrate 1. Then, a gate thin silicon oxide layer 3 is formed by thermally oxidizing the silicon substrate 1, and a gate electrode layer 4 is formed by a CVD process thereon. Then, $N^+$-type impurity doped regions 5-1 through 5-4 are formed by introducing N-type impurity ions into the silicon substrate 1 with a mask of the field silicon oxide layer 2 and the gate electrode layer 4. Then, a silicon oxide layer 6 is formed by a CVD process and is flattened by a CMP process. Then, a contact hole CONT1 is perforated in the silicon oxide layer 6. Then, a conductive layer 7 made of phosphorus or arsenic doped polycrystalline silicon or high melting temperature metal such as Ti and W is formed by a CVD process, to form one bit line. The conductive layer 7 is electrically connected via the contact hole CONT1 to the impurity doped region 5-1. Then, an insulating layer 8 is formed thereon by a CVD process. The insulating layer 8 is made of silicon oxide including an excess of 2 to 12 at % silicon, which is called a silicon rich oxide (SRO) layer.

Figure 4B:
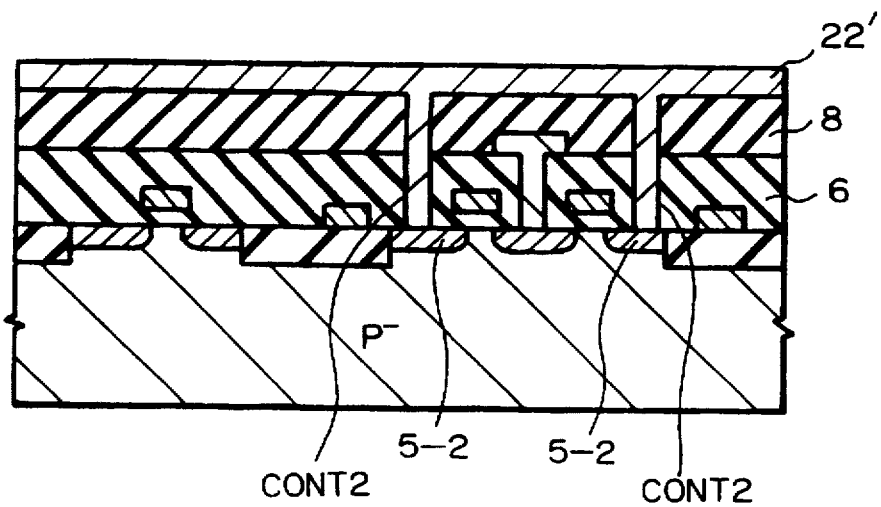
Figure 4C:
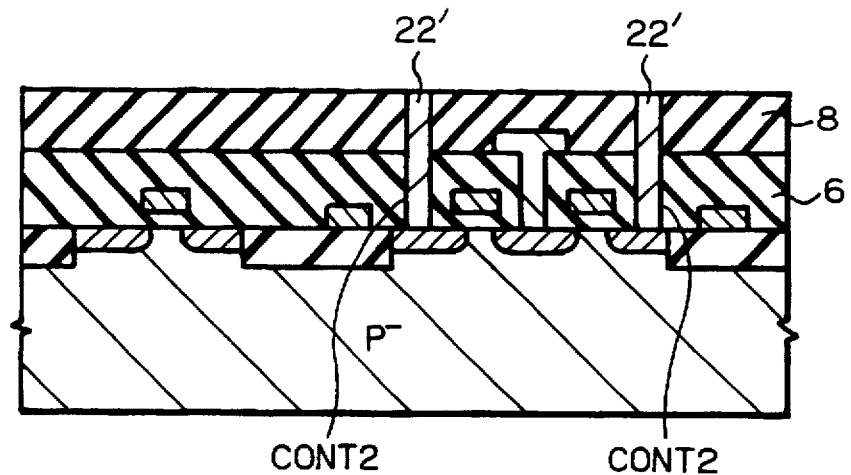

Next, referring to FIG. 4B, contact holes CONT2 are perforated in the insulating layer 8 and the silicon oxide layer 7. Then, a phosphorus doped polycrystalline silicon layer 22' is formed thereon by a CVD process. Next, the polycrystalline silicon layer 22' is flattened by a CMP process, so that the polycrystalline silicon layer 22' is buried in the contact holes CONT2, as shown in FIG. 4C.

Figure 4D:
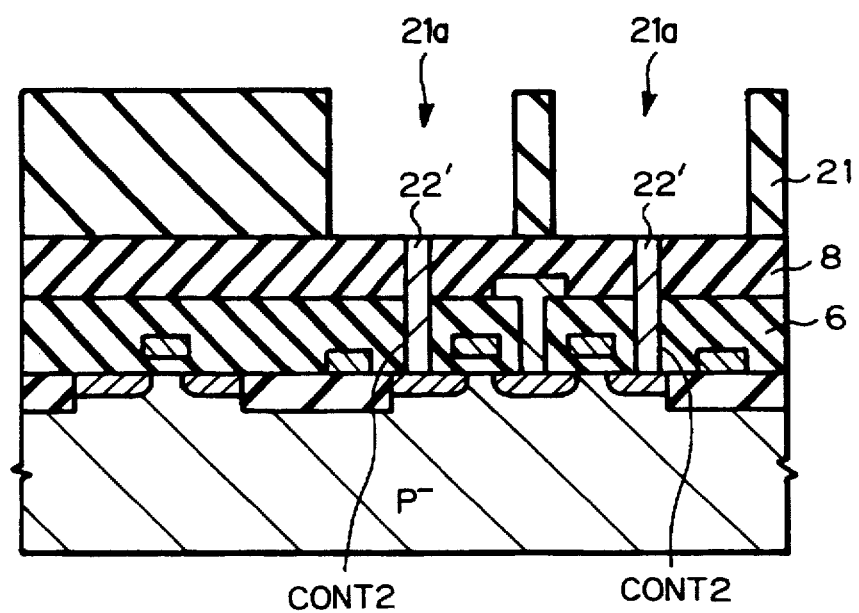

Next, referring to FIG. 4D, an about 500 to 1000 nm thick insulating layer 21 made of silicon oxide is formed by a CVD process. Then, openings 21a are perforated in the insulating layer 21 by a reactive ion etching (RIE) process using a mixture gas of $C_4H_8$ and CO. According to this RIE process, the etching rate of the insulating layer ($SiO_2$) 21 is remarkably larger than that of the insulating layer (SRO) 8, so that the insulating layer 8 is hardly etched. Also, the polycrystalline silicon layer 22' is hardly etched.

Note that, if the excess silicon of the insulating layer (SRO) 8 is larger than 12 at %, the insulating characteristics are remarkable reduced, in other words, the resistance value is reduced by less than 1/100 as compared with silicon oxide. Therefore, the excess silicon of the insulting layer 8 is preferably about 2 to 12 at %.

Figure 4E:
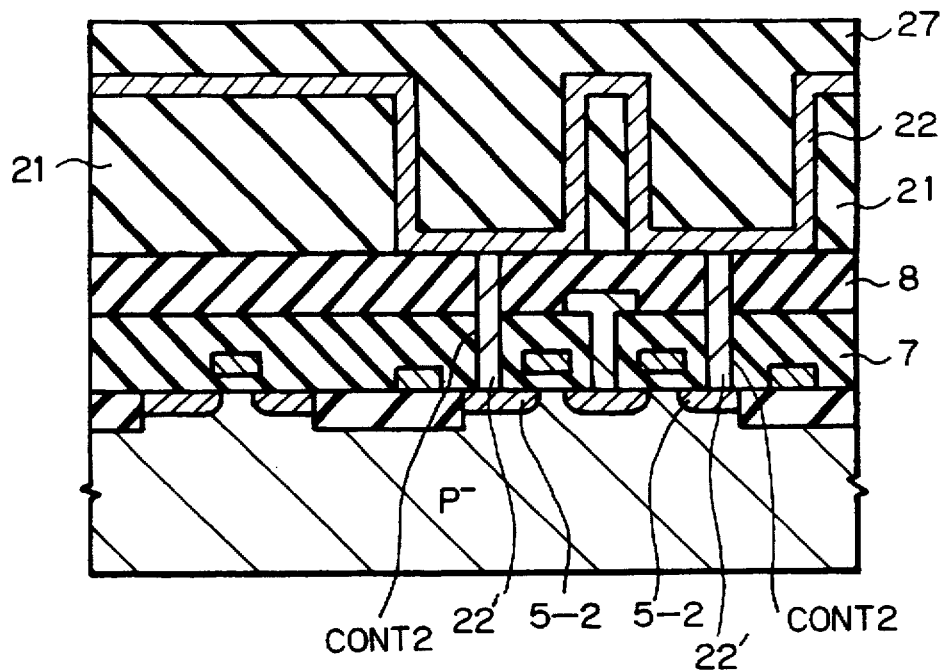

Next, referring to FIG. 4E, a capacitor lower electrode layer 22 made of phosphorus doped polycrystalline silicon or high melting temperature metal such as TiN, Pt or W is formed by a CVD process or a sputtering process. Thereafter, a core insulating layer 27 made of boron including phospho-silicated glass (BPSG) is formed by a CVD process.

Figure 4F:
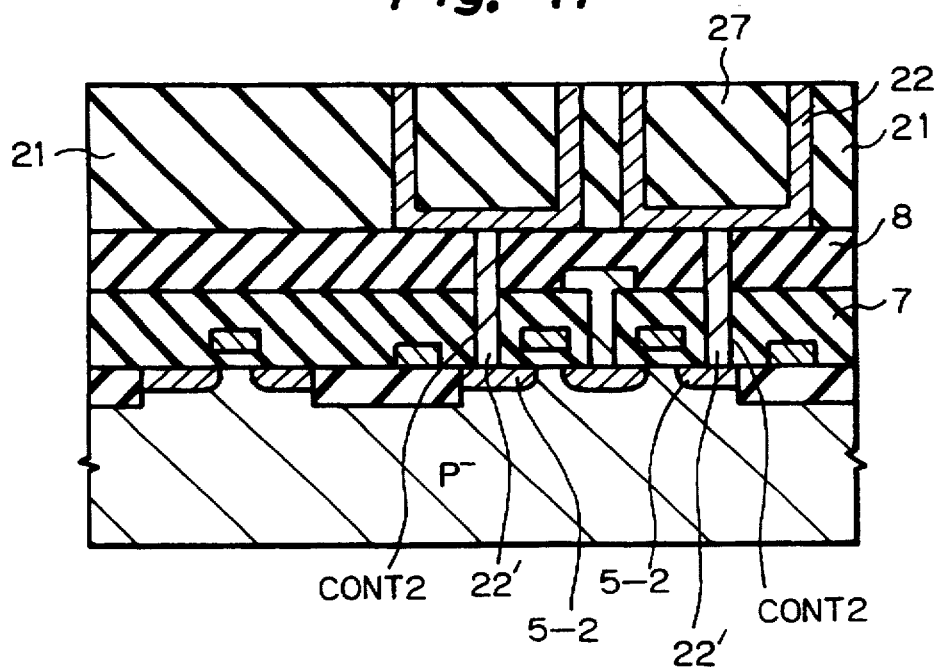

Next, a CMP process is performed upon the core insulating layer 27, and thereafter, a CMP process is further performed upon the capacitor lower electrode layer 22. As a result, as shown in FIG. 4F, the core insulating layer 27 is left in the openings of the insulating layer 21.

Figure 4G:
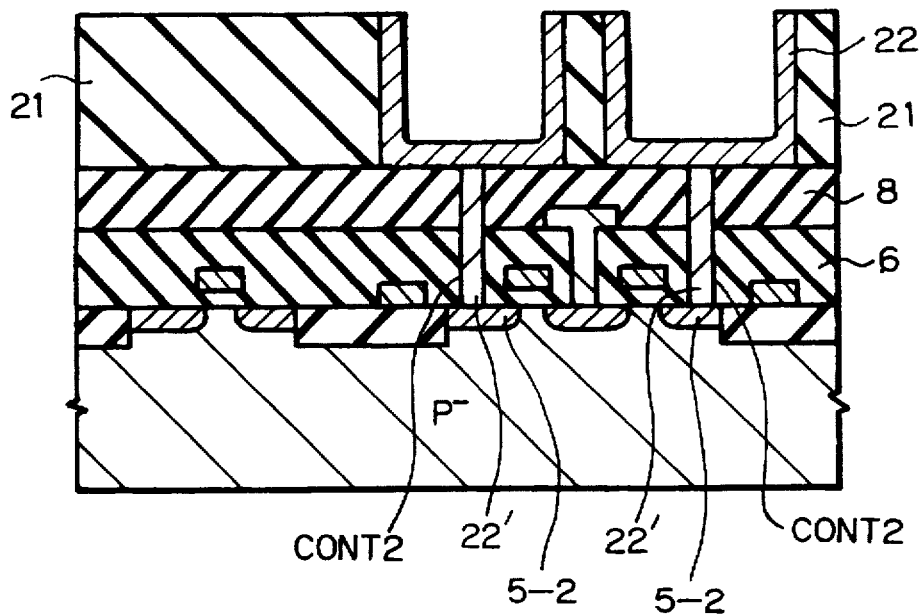

Next, referring to FIG. 4G, the core insulating layer 27 is etched by fluoric hydrogen gas under a low pressure less than 100 Torr at a chamber temperature of about 200° C. In this etching process, the etching rate of the core insulating layer (BPSG) 27 is remarkably larger than that of the insulating layer 21 by about 1000 times, so that the insulating layer 21 is hardly etched. Thus, the capacitor lower electrode layer 22 is electrically connected via the contact hole CONT2 to the impurity doped region 5-2.

Figure 4H:
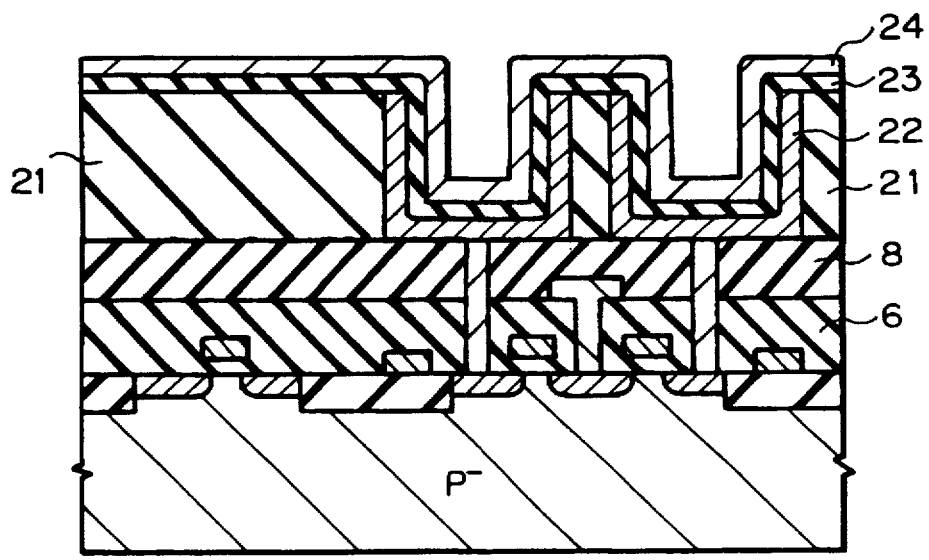
Figure 41:
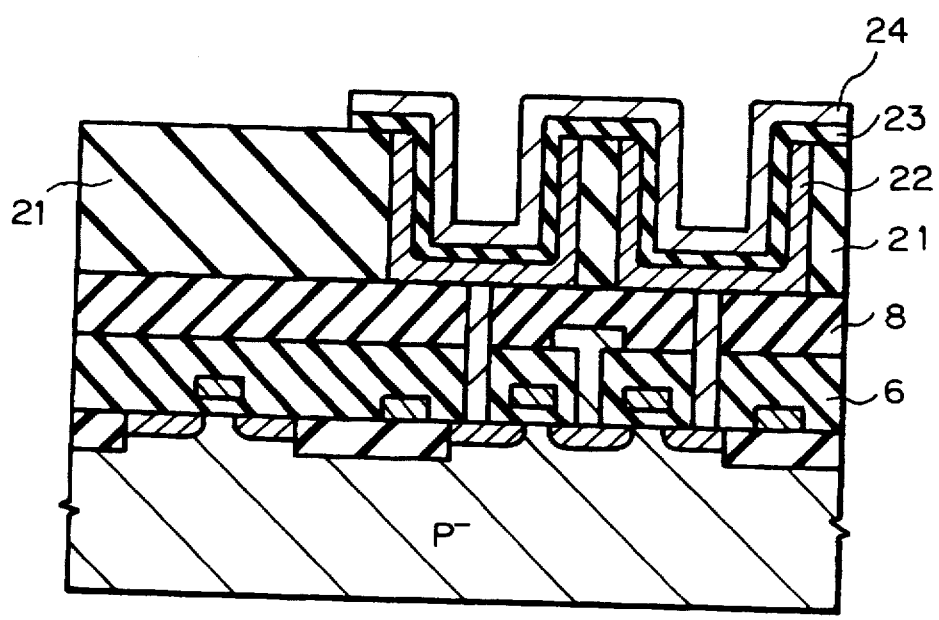

Next, referring to FIG. 4H, a capacitor insulating layer 23 made of silicon nitride, or ferroelectrics such as tantalum oxide, strontium titanate (STO), barium strontium titanate (BST) or lead titanium zirconate (PZT) is formed. Then, a capacitor upper electrode layer 24 made of laminated TiN and W is formed by a sputtering process.

Finally, referring to FIG. 4I, the capacitor upper electrode layer 24 and the capacitor insulating layer 23 are patterned.

Then, an insulating layer 25 and a first aluminum wiring layers 26 are formed to complete the device of FIG. 2.

Figure 5:
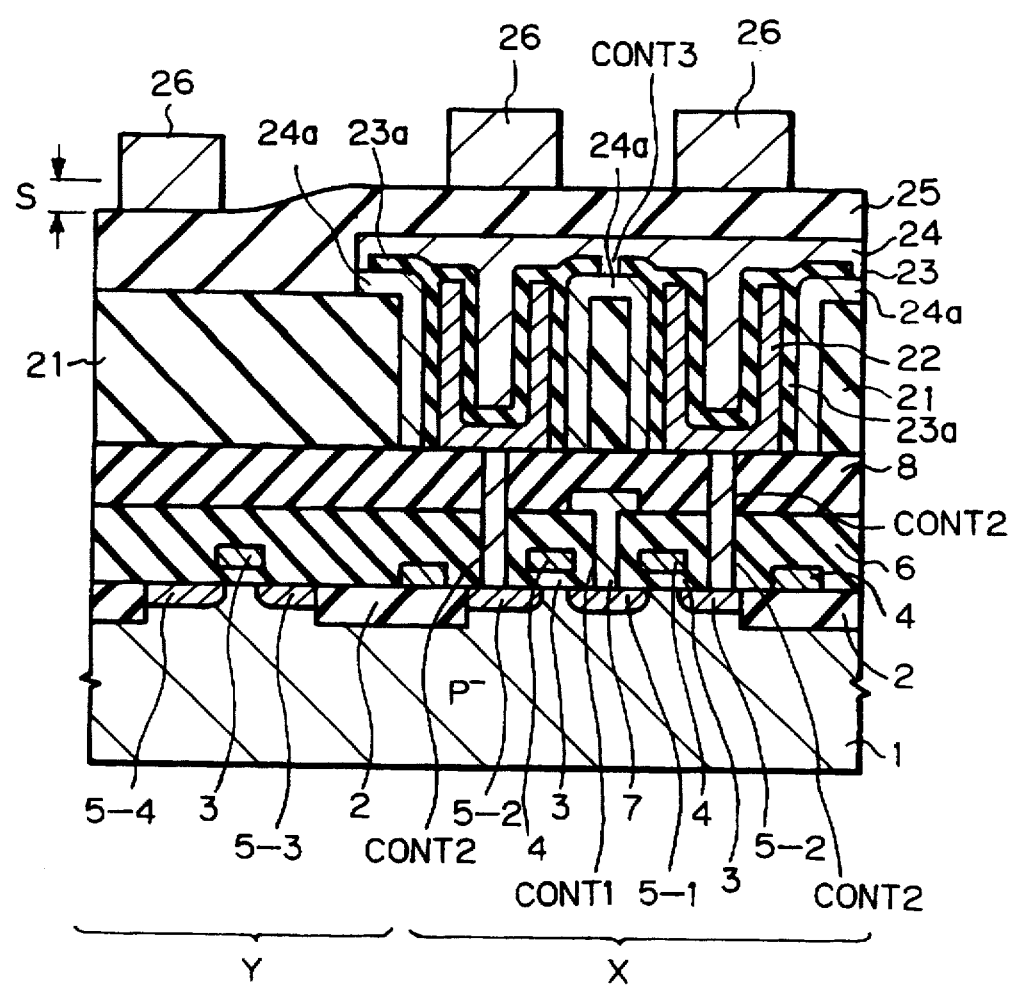
FIG. 5 is a cross-sectional view illustrating a second embodiment of the DRAM device according to the present invention.

In FIG. 5, which illustrates a second embodiment of the present invention, another capacitor upper electrode layer 24a is formed on sidewalls of the openings of the insulating layer 21 of FIG. 2, and another capacitor insulating layer 23a is formed between the capacitor lower electrode layer 22 and the capacitor upper electrode layer 24a. The capacitor upper electrode layer 24a is electrically connected via a contact hole CONT3 to the capacitor upper electrode layer 24.

Thus, also in the second embodiment as illustrated in FIG. 5, a step S between the memory cell array area X and the peripheral circuit area Y is remarkably reduced.

Figure 6:
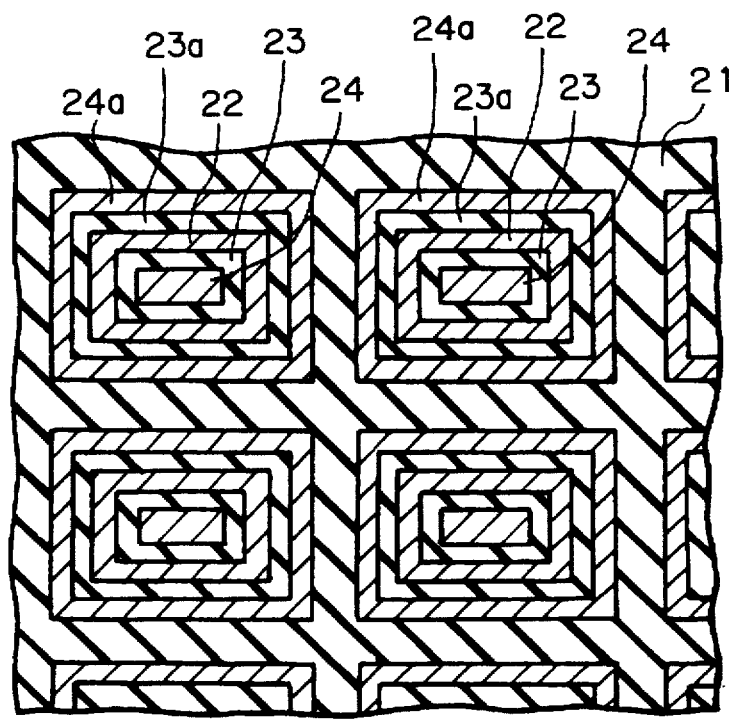
FIG. 6 is a traverse cross-sectional view of the capacitor lower electrode layer and the capacitor upper electrode layer of FIG. 5.

In FIG. 6, which is a traverse cross-sectional view of the capacitor lower electrode layer 22 and the capacitor upper electrode layer 24 (24a) taken along the line at the middle of the openings of the insulating layer 21 of FIG. 5, a stacked capacitor is formed not only by the capacitor lower electrode layer 22, the capacitor upper electrode layer 24, and the capacitor insulating layer 23 therebetween, but also by the capacitor lower electrode layer 22, the capacitor upper electrode layer 24a, and the capacitor insulating layer 23a therebetween. Also, the elements of the stacked capacitor are located within the opening of the insulting layer 21. Thus, the capacitance of the stacked capacitor is increased as compared with that in the first embodiment.

The manufacture of the device of FIG. 5 is explained next with reference to FIGS. 7A through 7L.

Figure 7A:
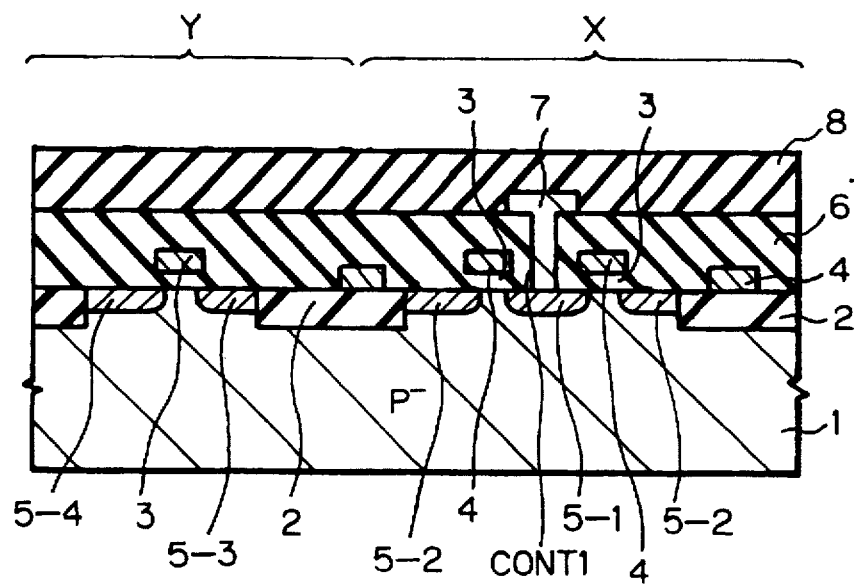
FIGS. 7A through 7M are cross-sectional views for explaining the manufacturing steps of the device of FIG. 5.
Figure 7B:
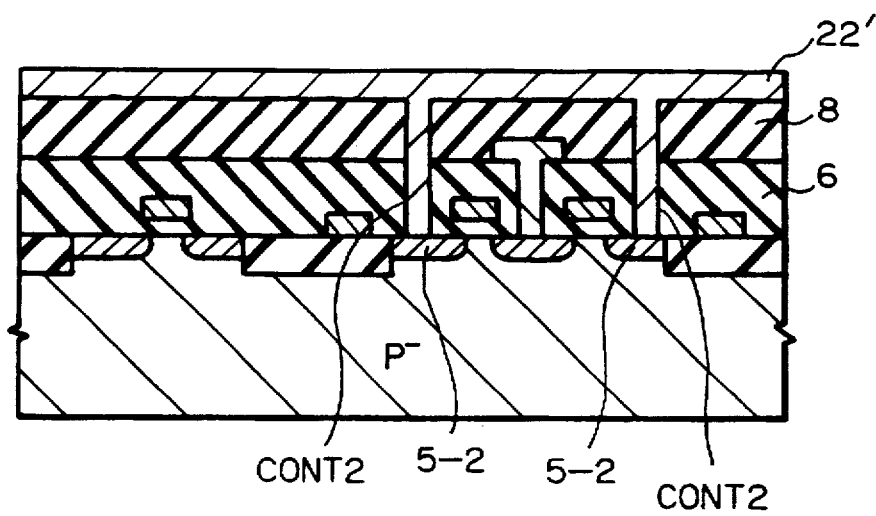
Figure 7C:
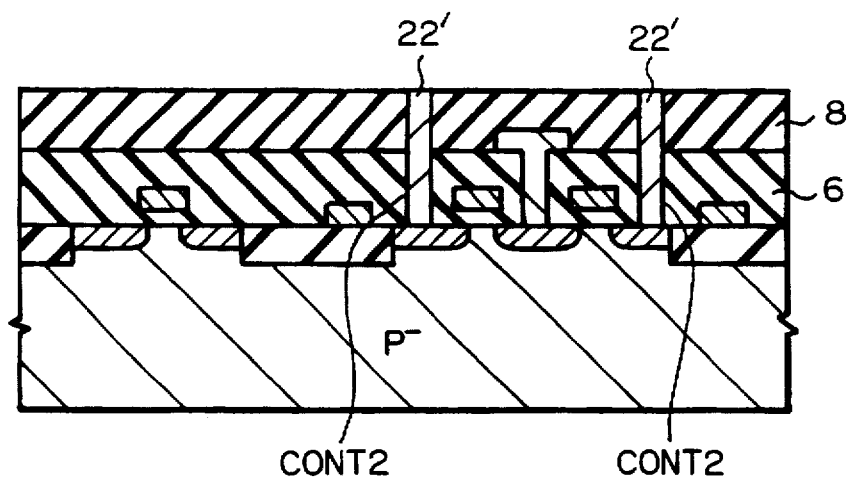

First, referring to FIGS. 7A, 7B and 7C, the same processes as shown in FIGS. 4A, 4B and 4C are carried out.

Figure 7D:
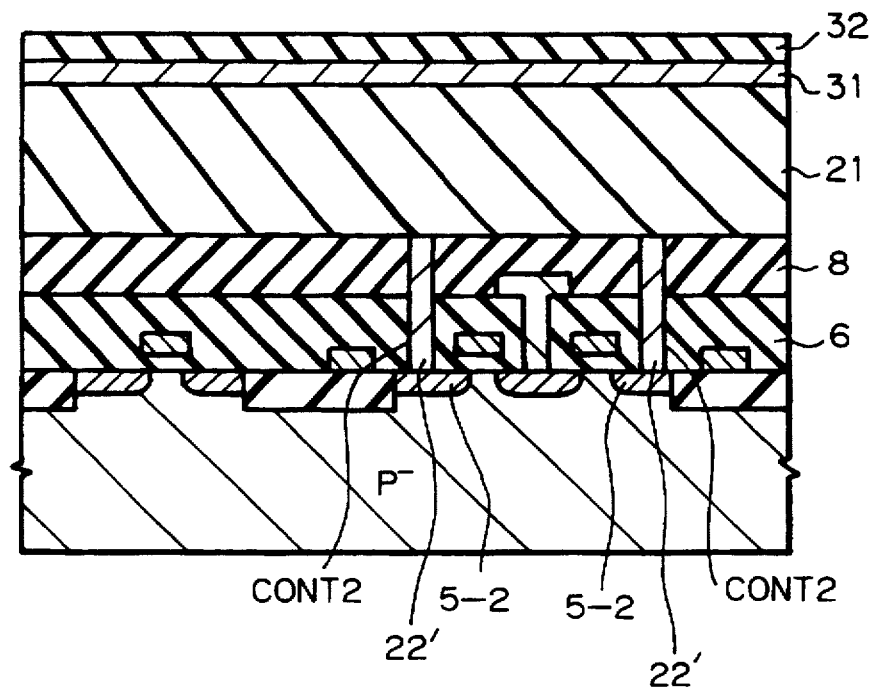

Next, referring to FIG. 7D, an about 500 to 1000 nm thick insulating layer 21 made of silicon oxide is formed by a CVD process. Then, an about 100 to 200 nm thick titanium nitride layer 31 is formed thereon, and thereafter, an about 100 nm thick silicon oxide layer 32 for a back-etching process is formed.

Next, referring to FIG. 7E, the silicon oxide layer 32 and the titanium nitride layer 31 are etched by an RIE process with a resist mask (not shown), Subsequently, openings 21a are perforated in the insulating layer 21 by this RIE process. In the same way as in FIG. 4D, this RIE process uses a mixture gas of $C_4H_8$ and CO. According to this RIE process, the etching rate of the insulating layer $(SiO_2)$ 21 is remarkably larger than that of the insulating layer (SRO) 8, so that the insulating layer 8 is hardly etched. Also, the polycrystalline silicon layer 22' is hardly etched.

Figure 7E:
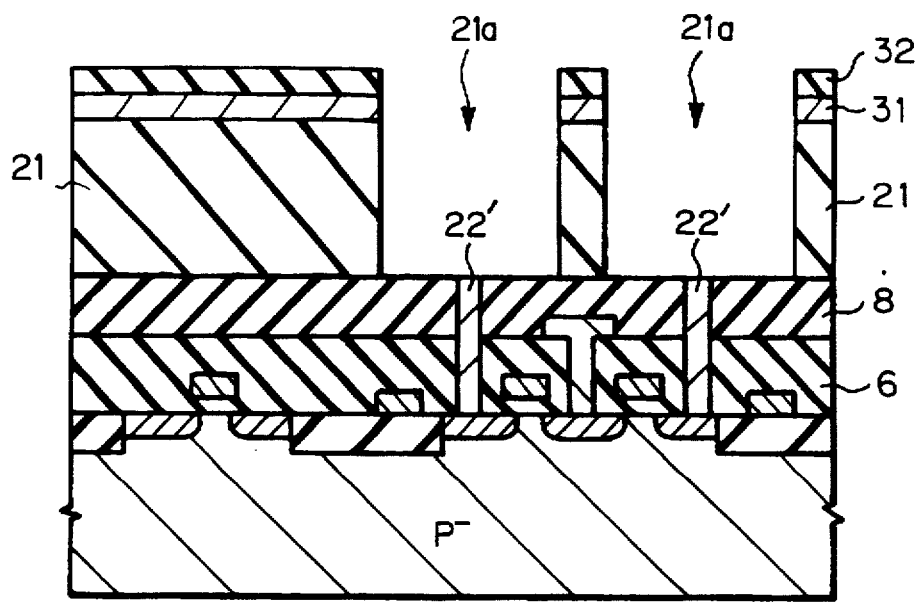
Figure 7F:
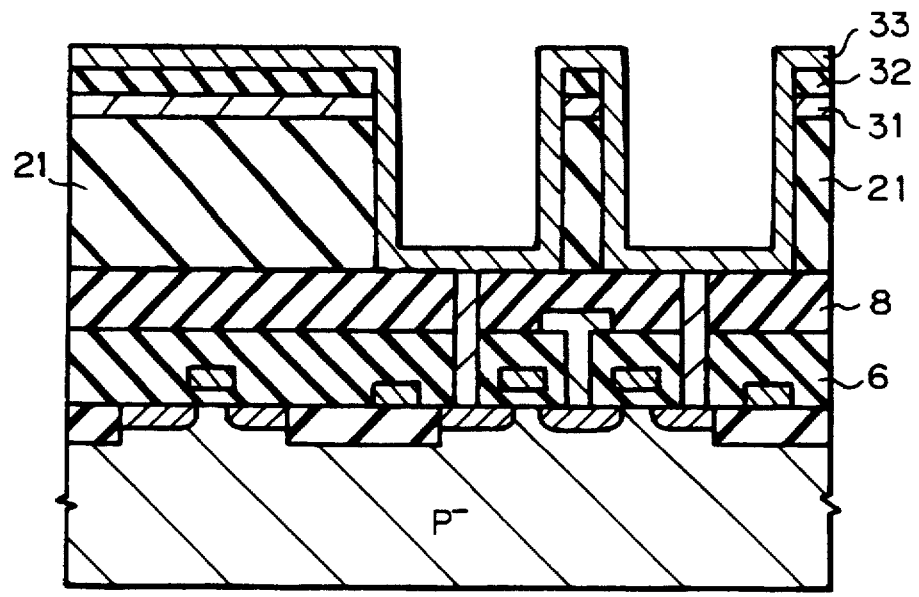
Figure 7G:
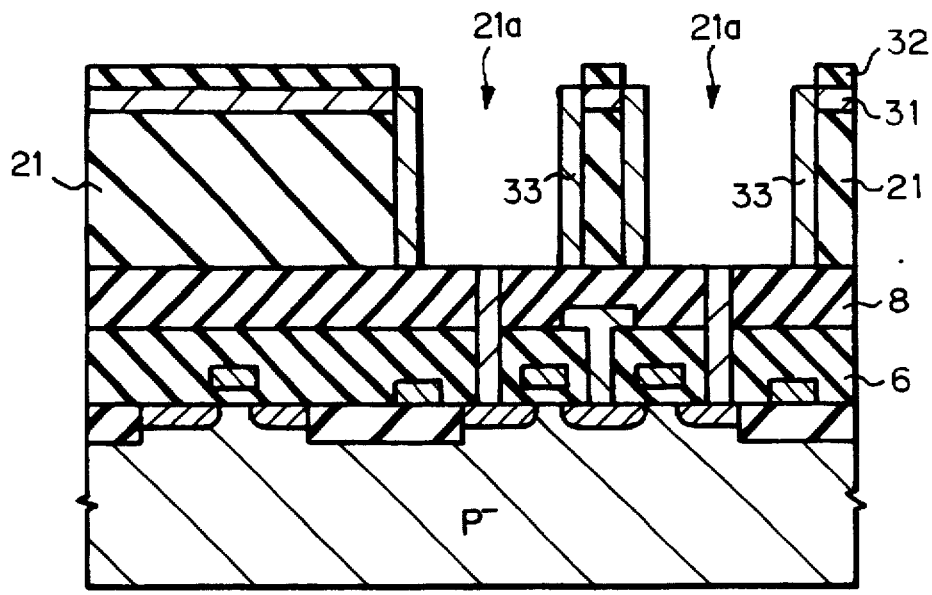

Next, referring to FIG. 7F, a titanium nitride layer 33 is again formed. Note that the thickness of the titanium nitride layer 33 is smaller than that of the titanium nitride layer 31. The titanium nitride layer 33 is anisotropically etched back by an RIE process using a mixture gas of HBr and $Cl_2$. As a result, as shown in FIG. 7G, the titanium nitride layer 33 is left on only the sidewalls of the openings 21a of the insulating layer 21.

Figure 7H:
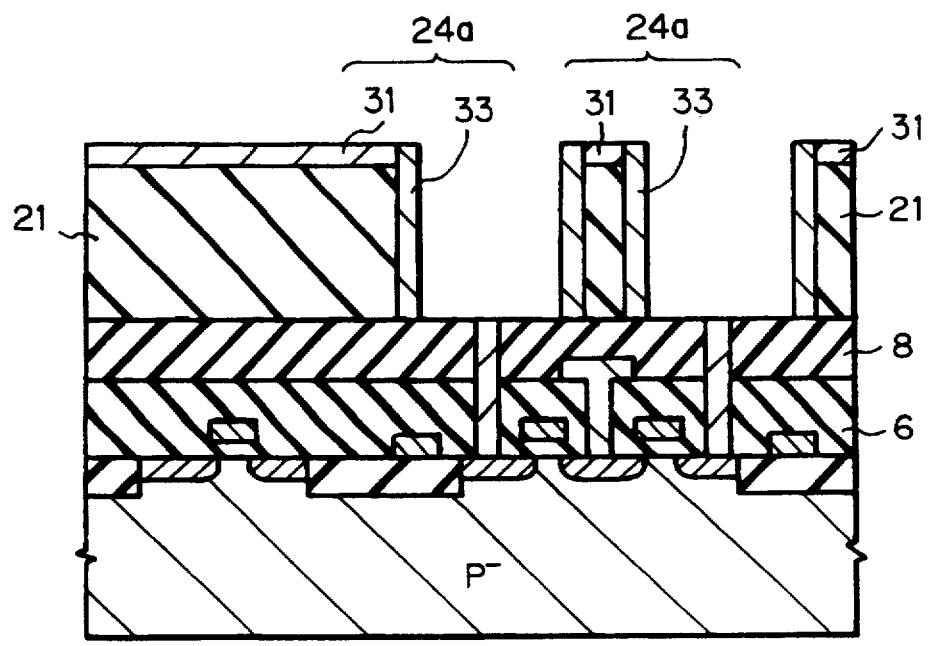
Figure 7:
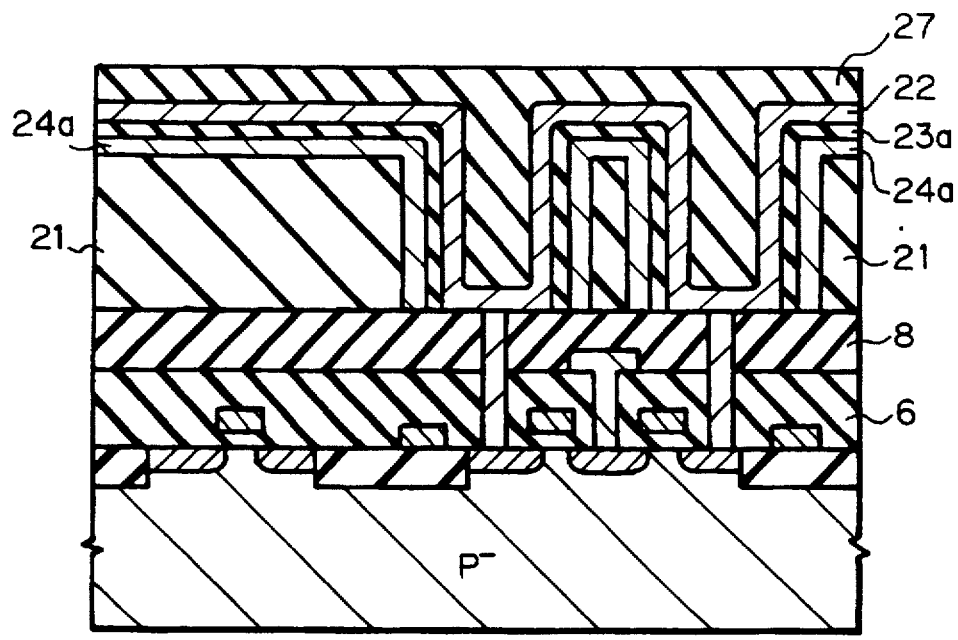
Figure 7:
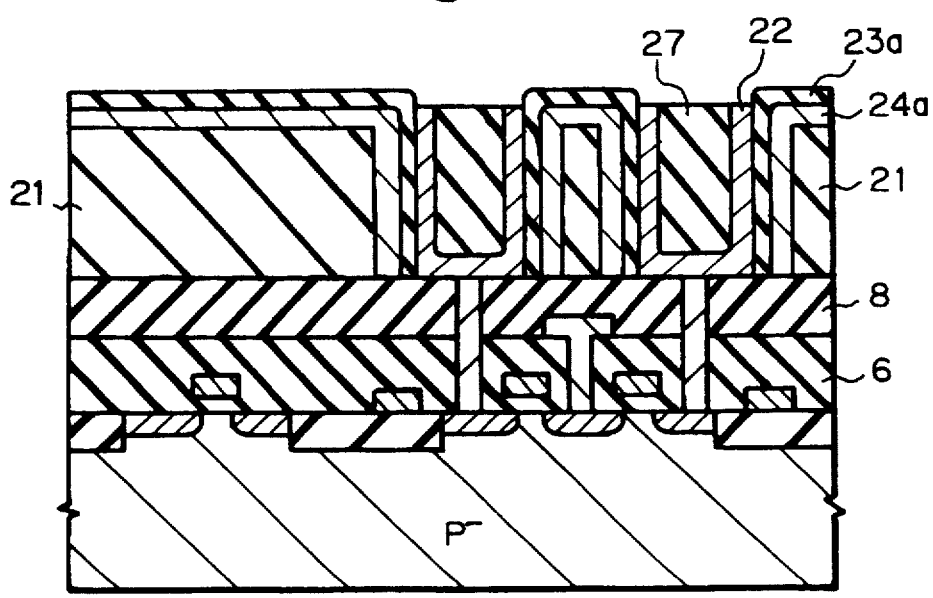

Then, the silicon oxide layer 32 is etched by using the same RIE process as shown in FIG. 7E. As a result, as shown in FIG. 7H, the capacitor upper electrode layer 24a is formed by the layers 31 and 33.

Next, referring to FIG. 7I, a capacitor insulating layer 23a made of silicon nitride, or ferroelectrics such as tantalum oxide, STO, BST or RZT is formed by a CVD process.

Next, referring to FIG. 7I, in a similar way as that shown in FIG. 4E, a capacitor lower electrode layer 22 made of phosphorus doped polycrystalline silicon or high melting temperature metal such as TiN, Pt or W is formed by a CVD process or a sputtering process. Thereafter, a core insulating layer 27 made of BPSG is formed by a CVD process.

Next, a CMP process is performed upon the core insulating layer 27, and thereafter, a CMP process is further performed upon the capacitor lower electrode layer 22. As a result, as shown in FIG. 7J, the core insulating layer 27 is left in the openings of the insulating layer 21.

Figure 7K:
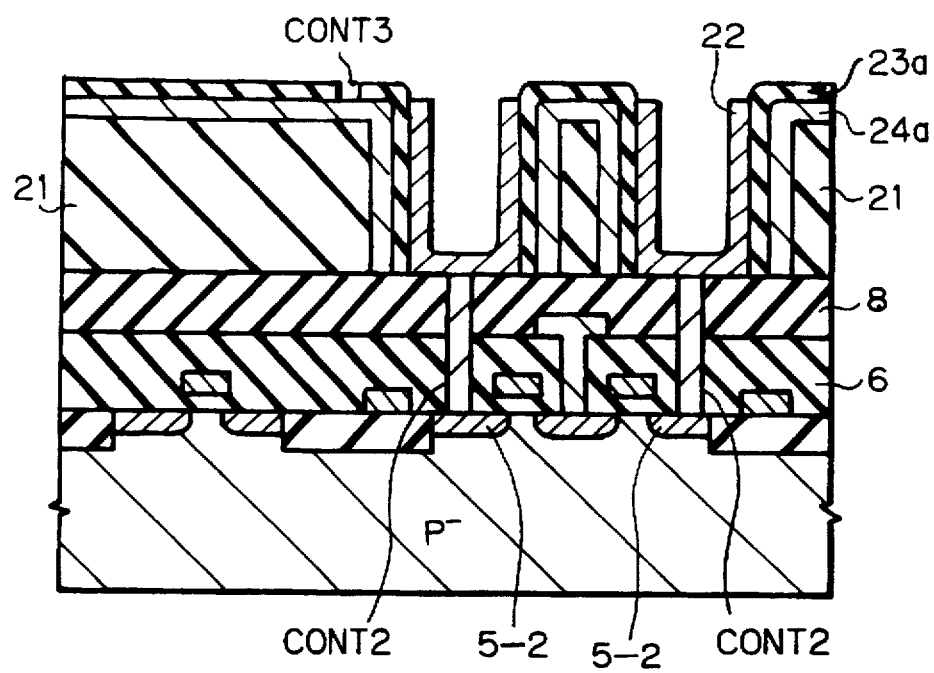

Next, referring to FIG. 7K, in the same way as in FIG. 4G, the core insulating layer 27 is etched by fluoric hydrogen gas under a low pressure less than 100 Torr at a chamber temperature of about 200° C. In this etching process, the etching rate of the core insulating layer (BPSG) 27 is remarkably larger than that of the insulating layer 21 by about 1000 times, so that the insulating layer 21 is hardly etched. Thus, the capacitor lower electrode layer 22 is electrically connected via the contact hole CONT2 to the impurity doped region 5-2. Also, a contact holes CONT3 is perforated in the capacitor insulating layer 23a.

Figure 7L:
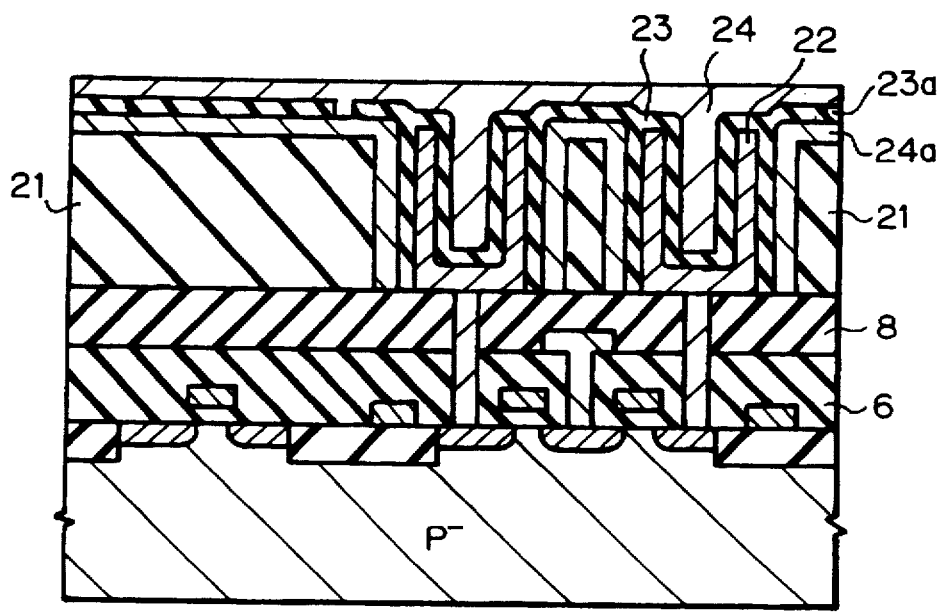

Next, referring to FIG. 7L, in the same way as in FIG. 4H, a capacitor insulating layer 23 made of silicon nitride, or ferroelectrics such as tantalum oxide, STO, BST or PZT is formed. Then, a capacitor upper electrode layer 24 made of laminated TiN and W is formed by a sputtering process.

Figure 7M:
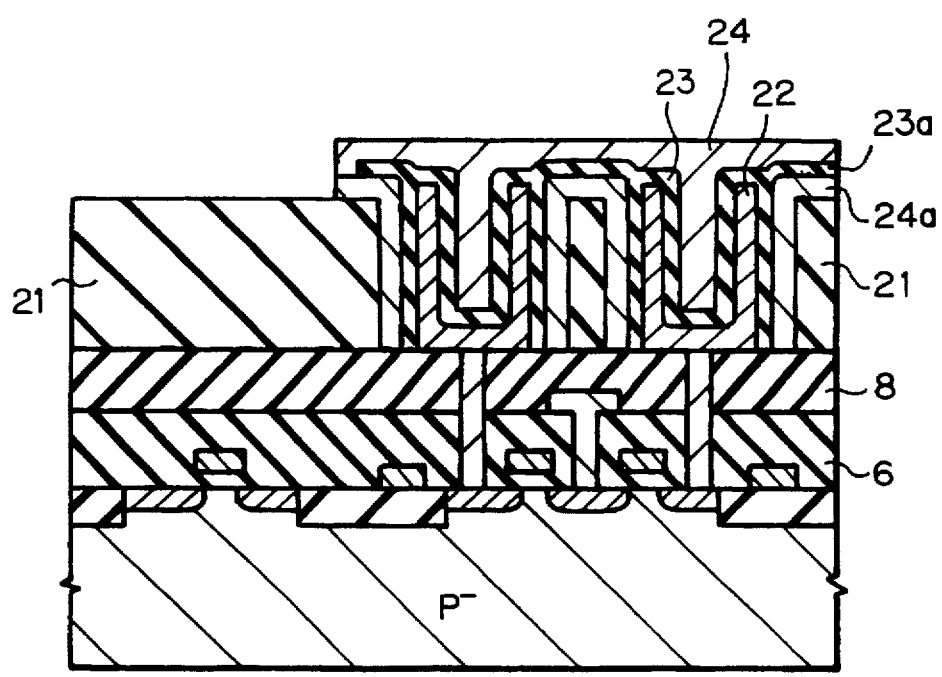

Finally, referring to FIG. 7M, in the same way as in FIG. 4I, the capacitor upper electrode layer 24 and the capacitor insulating layer 23 are patterned.

Then, an insulating layer 25 and a first aluminum wiring layers 26 are formed to complete the device of FIG. 5.

Figure 8:
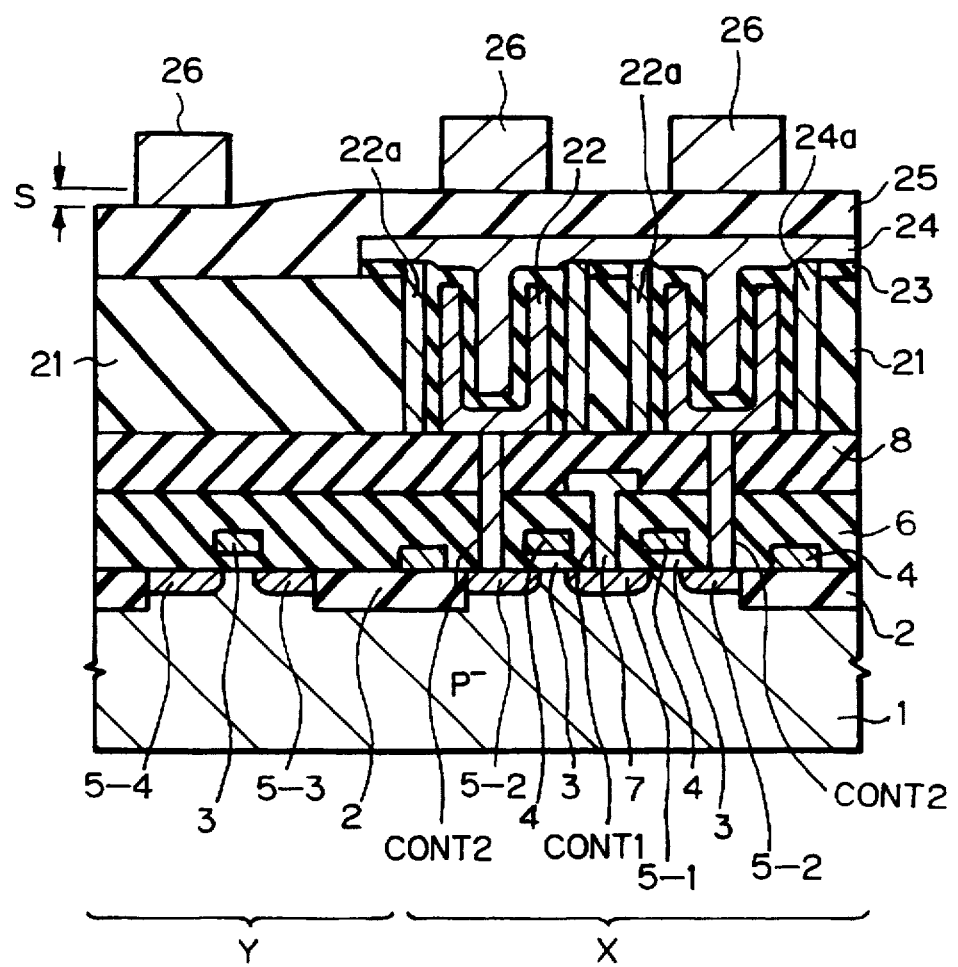
FIG. 8 is a cross-sectional view illustrating a modification of the device of FIG. 5.

In FIG. 8, which is a modification of the device of FIG. 5, the capacitor upper electrode layer 22a is provided on only the sidewalls of the openings of the insulating layer 21. That is, the capacitor upper electrode layer 22a is not provided on the insulating layer 21. In this case, the capacitor upper electrode layer 22a is directly connected to the capacitor electrode layer 22. Thus, in the device of FIG. 5, a step S between the memory cell array area X and the peripheral circuit area Y is reduced as compared with the second embodiment as illustrated in FIG. 5. However, the capacitance of the stacked capacitor is a little reduced as compared with the second embodiment as illustrated in FIG. 5. The manufacture of the device of FIG. 8 is the same as that of the device of FIG. 5 except that the titanium nitride layer 31 and the silicon oxide layer 32 as shown in FIG. 7D are not formed.

Figure 9:
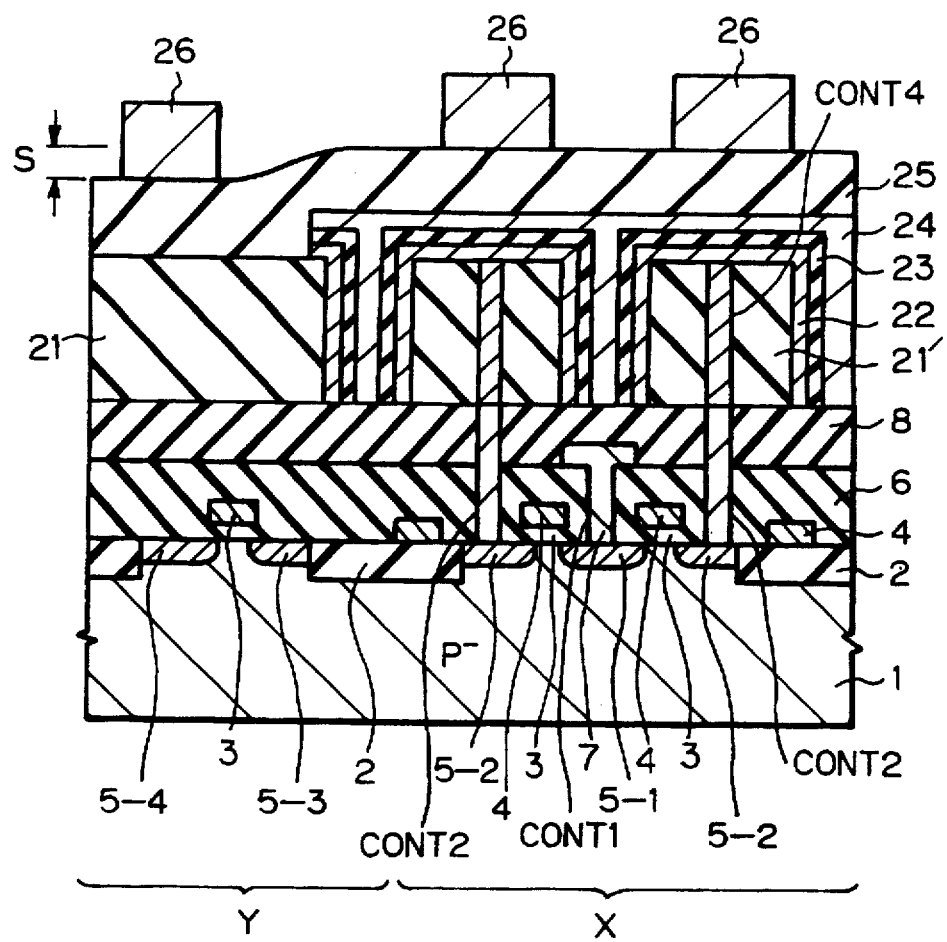
FIG. 9 is a cross-sectional view illustrating a third embodiment of the DRAM device according to the present invention.

In FIG. 9, which illustrates a third embodiment of the present invention, an about 500 to 1000 nm thick insulating layer 21 made of silicon oxide is formed on the insulating layer 8. A plurality of grooves such as rectangular grooves are perforated in the insulating layer 21, so that a plurality of insulating islands 21' are formed in the memory cell array area X. Stacked capacitors are formed on the insulating islands 21'. That is, a capacitor lower electrode layer 22 is formed on each of the insulating islands 21'. The capacitor lower electrode layer 22 is made of phosphorus or arsenic doped polycrystalline silicon or high melting temperature metal such as TiN. The capacitor lower electrode layer 22 is electrically connected via a contact hole CONT4 of the respective insulating island 21' and the contact hole CONT2 to the impurity doped region 5-2. Also, a capacitor insulating layer 23 made of silicon nitride, or ferroelectrics such as tantalum oxide, STO, BST or PZT is formed on the capacitor lower electrode layer 22. Further, a capacitor upper electrode layer 24 made of laminated TiN and W are formed commonly for the memory cells. Then, an insulating layer 25 is formed thereon, and first wiring layers 26 made of aluminum are formed by using a sputtering process. Finally, another insulating layer and second wiring layers (not shown) are formed.

Thus, also in the third embodiment as illustrated in FIG. 9, a step S between the memory cell array area X and the peripheral circuit area Y is remarkably reduced.

Figure 10:
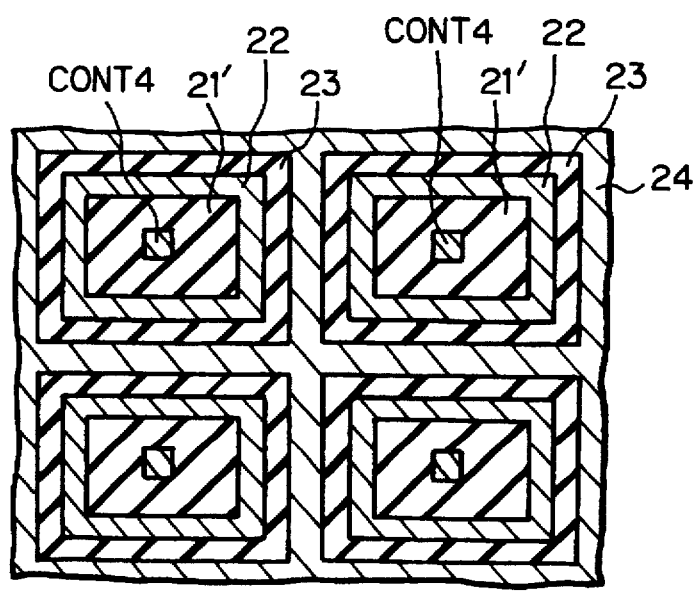
FIG. 10 is a traverse cross-sectional view of the capacitor lower electrode layer and the capacitor upper electrode layer of FIG. 9.

In FIG. 10, which is a traverse cross-sectional view of the capacitor lower electrode layer 22 and the capacitor upper electrode layer 24 taken along the line at the middle of the insulating islands 21' of the insulating layer 21 of FIG. 9, a stacked capacitor is formed by the capacitor lower electrode layer 22, the capacitor upper electrode layer 24, and the capacitor insulating layer 23 therebetween.

The manufacture of the device of FIG. 9 is explained next with reference to FIGS. 11A through 11K.

Figure 11A:
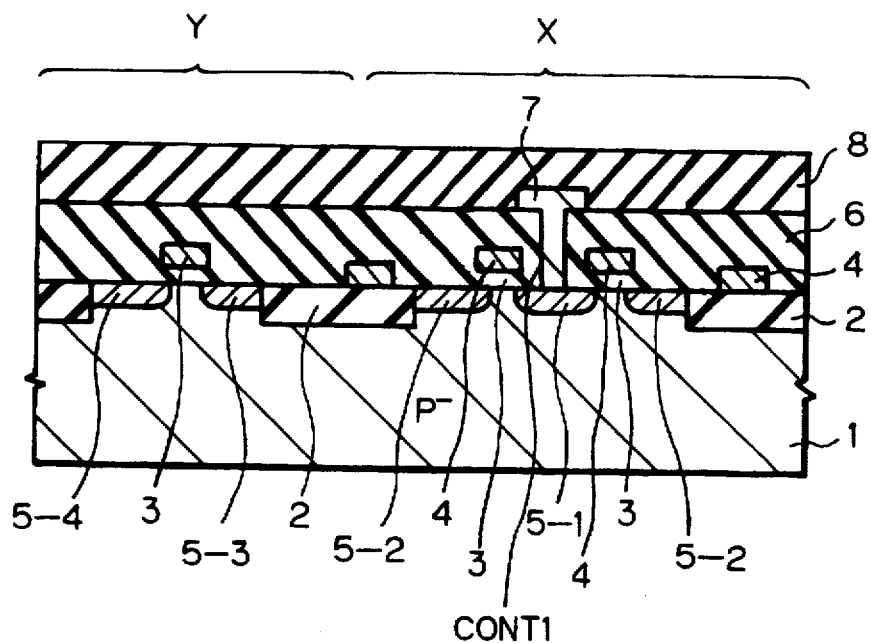
FIGS. 11A through 11I are cross-sectional views for explaining the manufacturing steps of the device of FIG. 9.
Figure 11B:
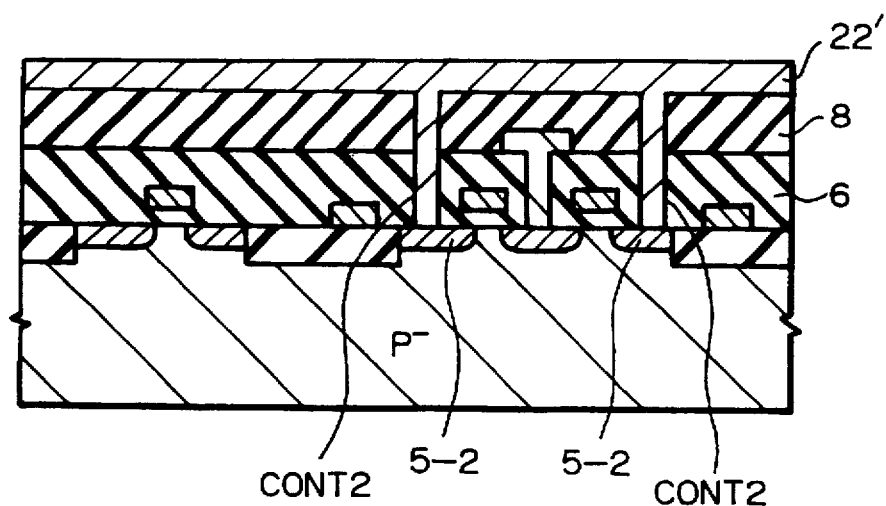
Figure 11C:
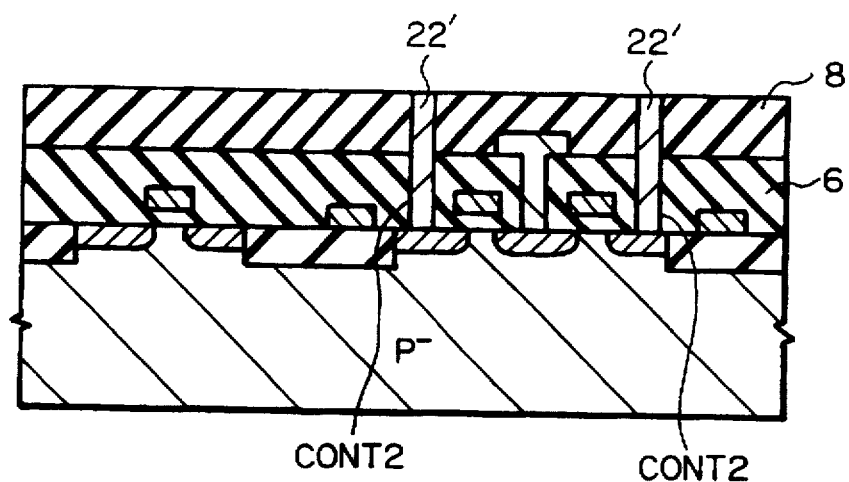

First, referring to FIGS. 11A, 11B and 11C, the same processes as shown in FIGS. 4A, 4B and 4C are carried out.

Figure 11D:
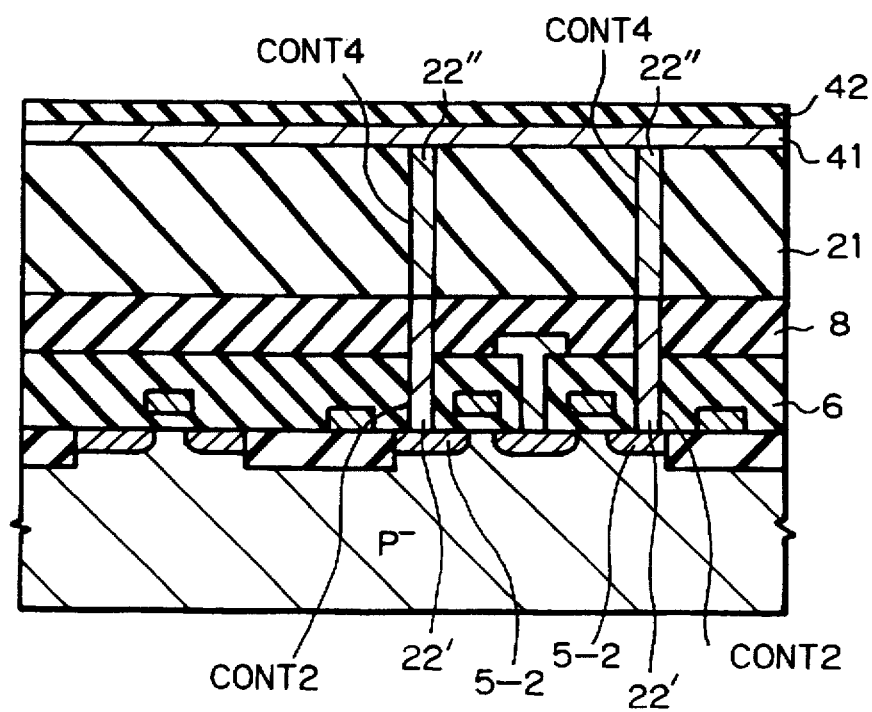

Next, referring to FIG. 11D, an about 500 to 1000 nm thick insulating layer 21 made of silicon oxide is formed by a CVD process. Then, contact holes CONT4 are perforated in the insulating layer 21. Then, a phosphorus doped polycrystalline silicon layer 22" is buried in the contact holes CONT4 in the same way as the phosphorus doped polycrystalline silicon layer 22' buried in the contact holes CONT2. Then, an about 100 to 200 nm thick titanium nitride layer 41 is formed thereon, and thereafter, an about 100 nm thick silicon oxide layer 32 for a back-etching process is formed.

Figure 11E:
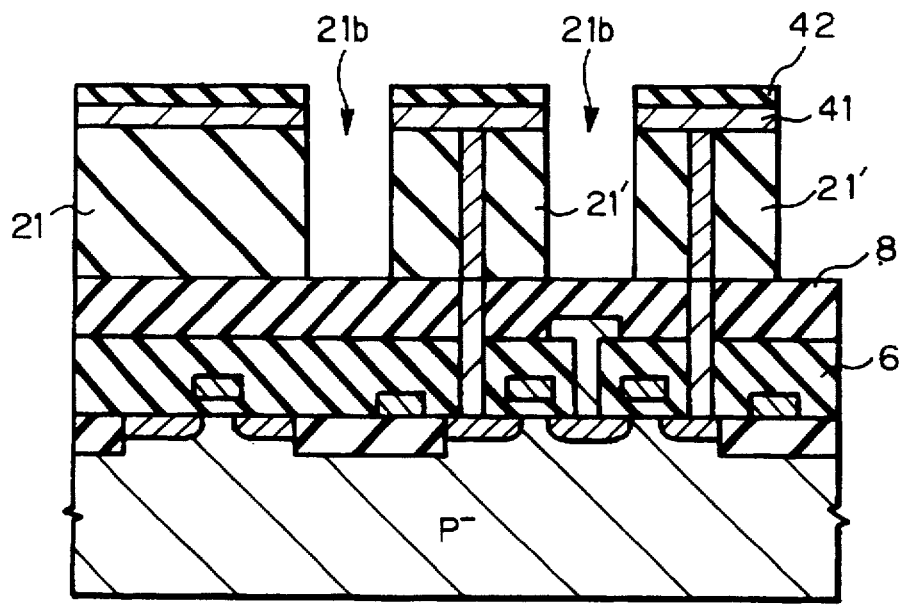

Next, referring to FIG. 11E, the silicon oxide layer 42 and the titanium nitride layer 41 are etched by an RIE process with a resist mask (not shown). Subsequently, grooves 21b are perforated in the insulating layer 21 by this RIE process. As a result, insulating islands 21' are formed in the memory cell array X. Note that this RIE uses a mixture gas of $C_4H_8$ and CO in the same way as in FIG. 4D. Therefore, the etching rate of the insulating layer ($SiO_2$) 21 is remarkably larger than that of the insulating layer (SRO) 8, so that the insulating layer 8 is hardly etched.

Figure 11F:
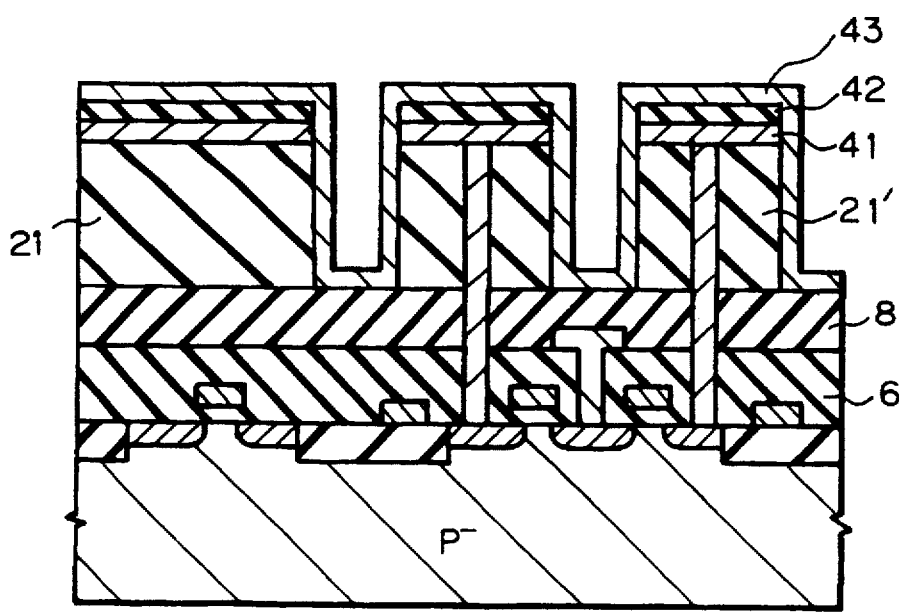
Figure 11G:
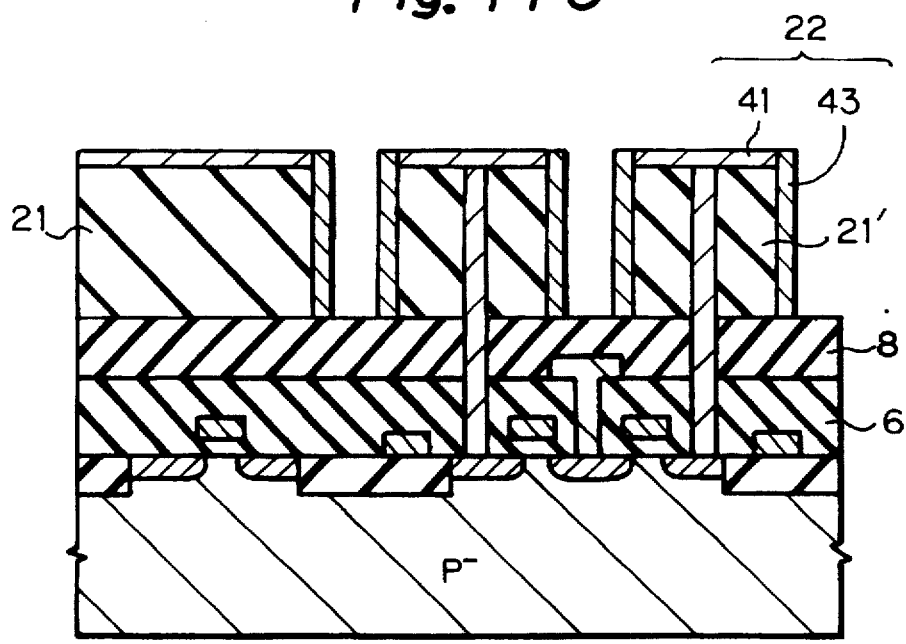

Next, referring to FIG. 11F, a titanium nitride layer 43 is again formed. Note that the thickness of the titanium nitride layer 43 is smaller than that of the titanium nitride layer 41. The titanium nitride layer 43 is anisotropically etched back by an RIE process using a mixture gas of HBr and $Cl_2$. As a result, as shown in FIG. 11G, the titanium nitride layer 43 is left on only the sidewalls of the insulating islands 21' of the insulating layer 21.

Thus, a capacitor lower electrode layer 22 is constructed by the layers 41 and 42.

Figure 11H:
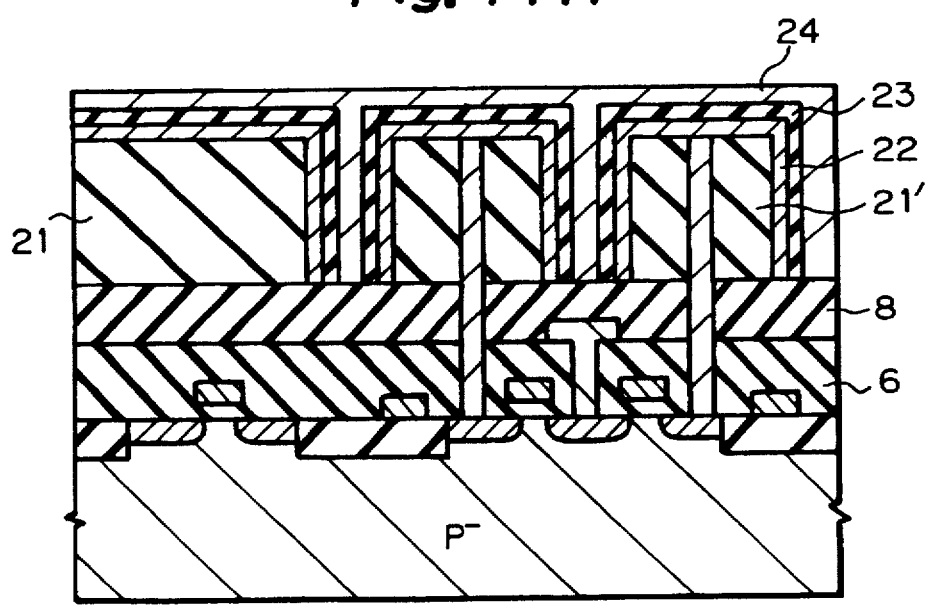

Next, referring to FIG. 11H, a capacitor insulating layer 23 made of silicon nitride, or ferroelectrics such as tantalum oxide, STO, BST or PZT is formed by a CVD process. Also, a capacitor insulating layer 23 made of silicon nitride, or ferroelectrics such as tantalum oxide, STO or BST or PZT. Then, a capacitor upper electrode layer 24 made of laminated TiN and W is formed by a sputtering process.

Figure 11I:
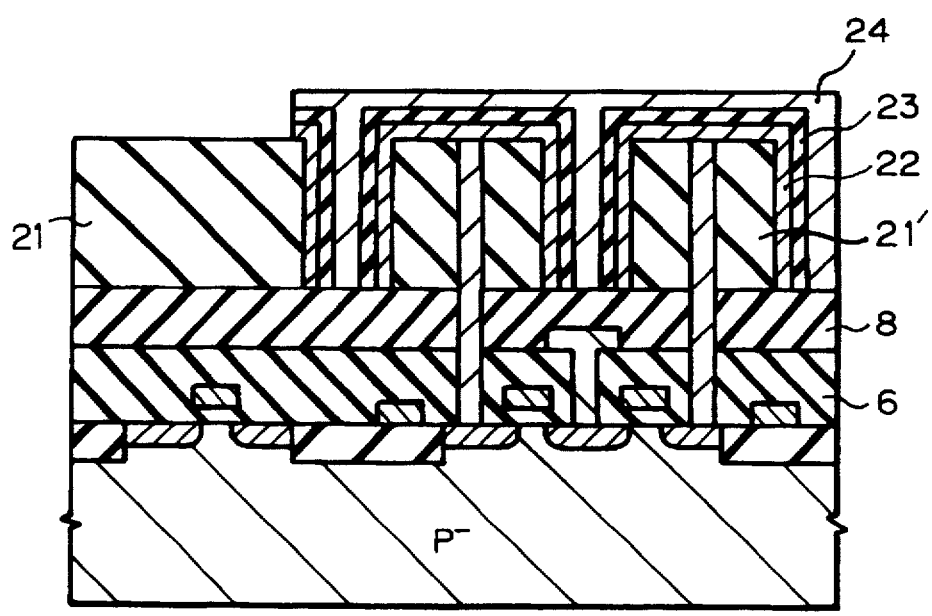

Finally, referring to FIG. 11I, the capacitor upper electrode layer 24 and the capacitor insulating layer 23 are patterned.

Then, an insulating layer 25 and first aluminum wiring layers 26 are formed to complete the device of FIG. 9.

Figure 12:
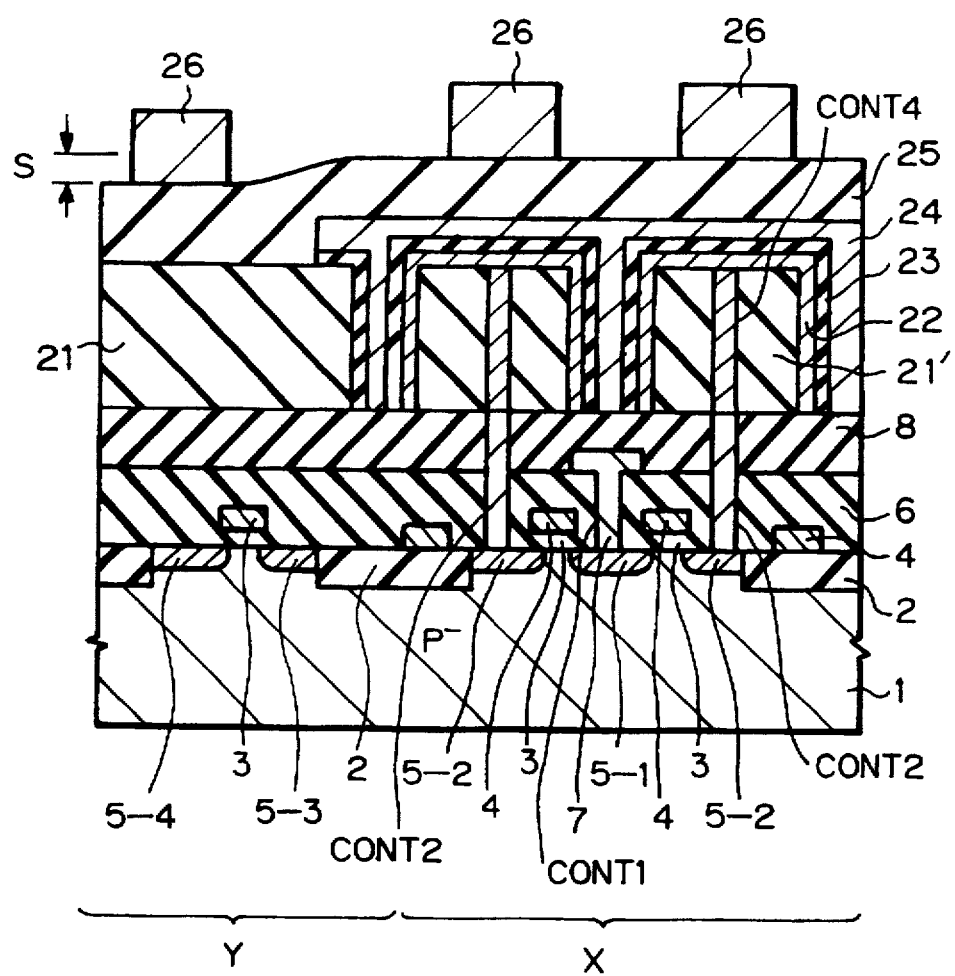
FIG. 12 is a cross-sectional view illustrating a modification of the device of FIG. 9.

In FIG. 12, which is a modification of the device of FIG. 9, the capacitor lower electrode layer 22 on the insulating layer 21 on the peripheral circuit area Y is not provided. As a result, a step S between the memory cell array area X and the peripheral circuit area Y is reduced as compared with the third embodiment illustrated in FIG. 9. The manufacture of the device of FIG. 12 is the same as that of FIG. 9 except that an RIE process using a resist pattern is added to remove the capacitor lower electrode 22 on the insulating layer 21 in FIG. 11G.

Figure 13:
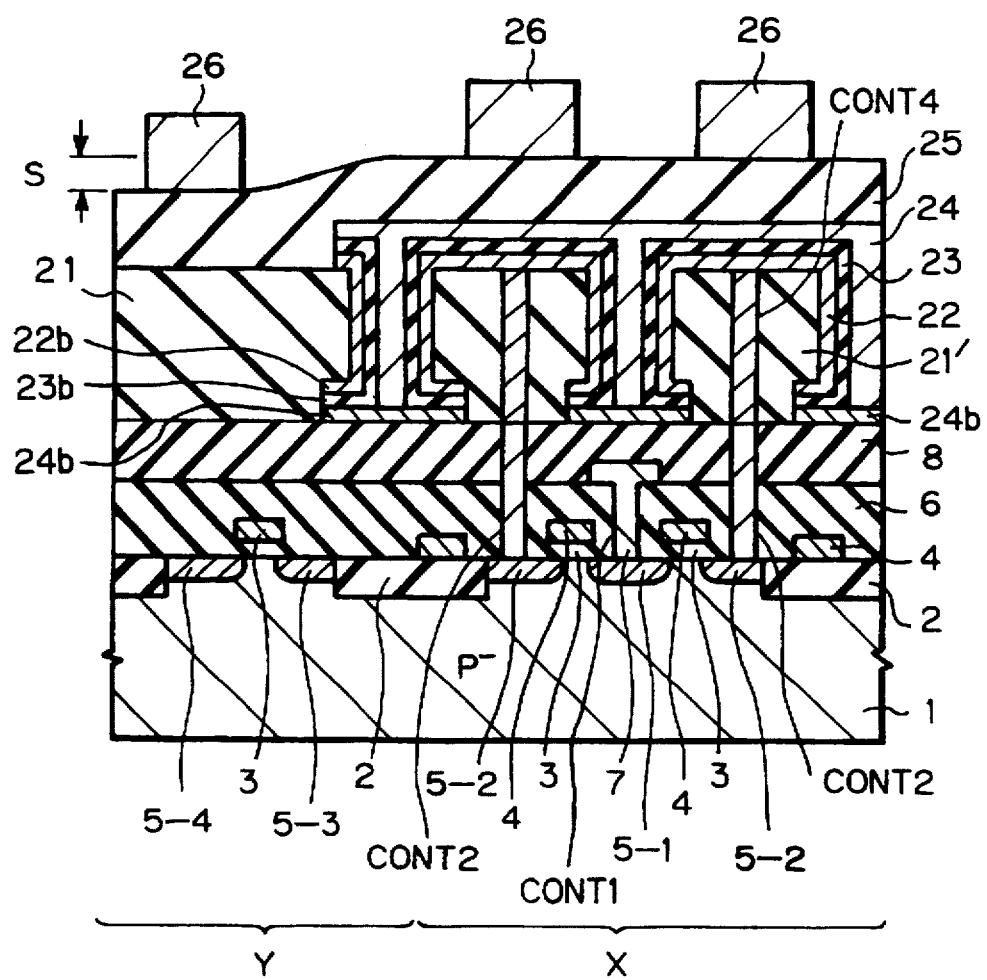
FIG. 13 is a cross-sectional view illustrating a fourth embodiment of the DRAM device according to the present invention.

In FIG. 13, which illustrates a fourth embodiment of the present invention, another capacitor upper electrode layer 24b is formed on insulating layer 8 of FIG. 9, and another capacitor insulating layer 23b is formed between another capacitor lower electrode layer 22b and the capacitor upper electrode layer 24b. The capacitor upper electrode layer 24b is electrically connected to the capacitor upper electrode layer 24.

Thus, also in the fourth embodiment as illustrated in FIG. 13, a step S between the memory cell array area X and the peripheral circuit area Y is remarkably reduced. Further, the capacitance of the stacked capacitor is increased as compared with that in the third embodiment.

The manufacture of the device of FIG. 13 is explained next with reference to FIGS. 14A through 14K.

Figure 14A:
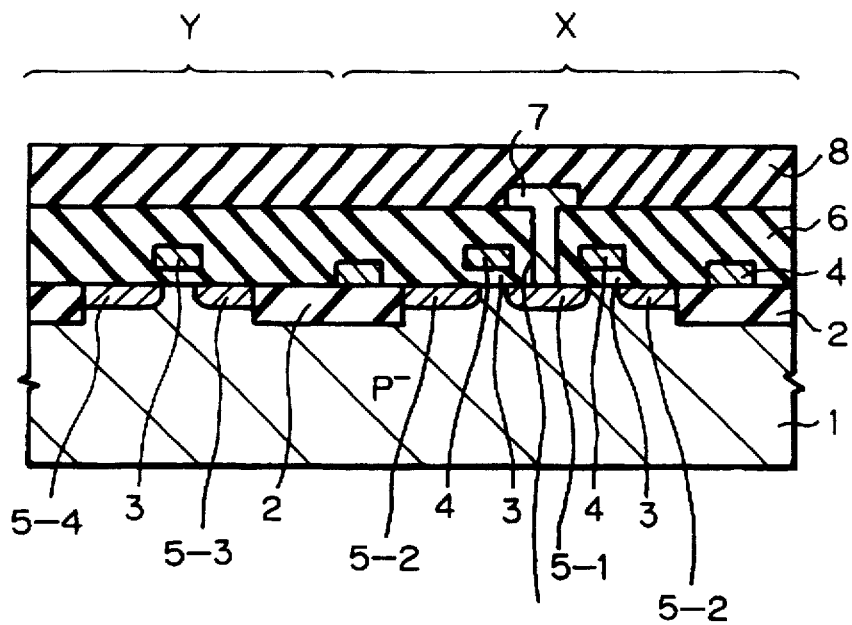
FIGS. 14A through 14K are cross-sectional views for explaining the manufacturing steps of the device of FIG. 13.
Figure 14B:
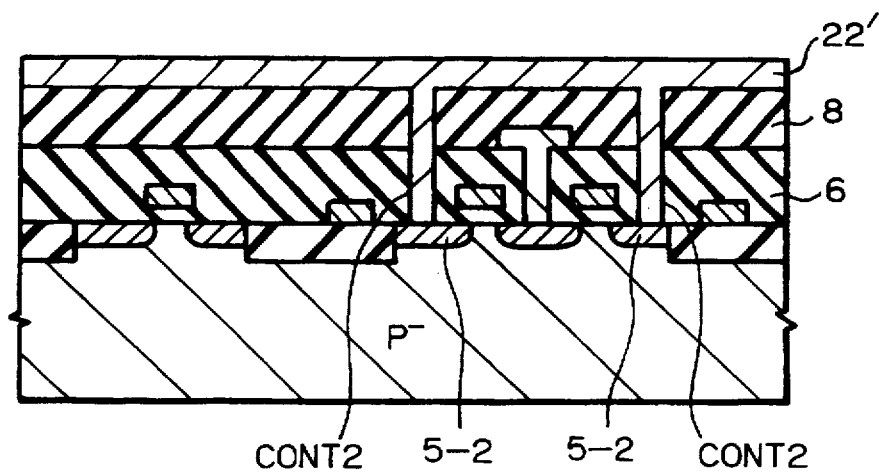
Figure 14C:
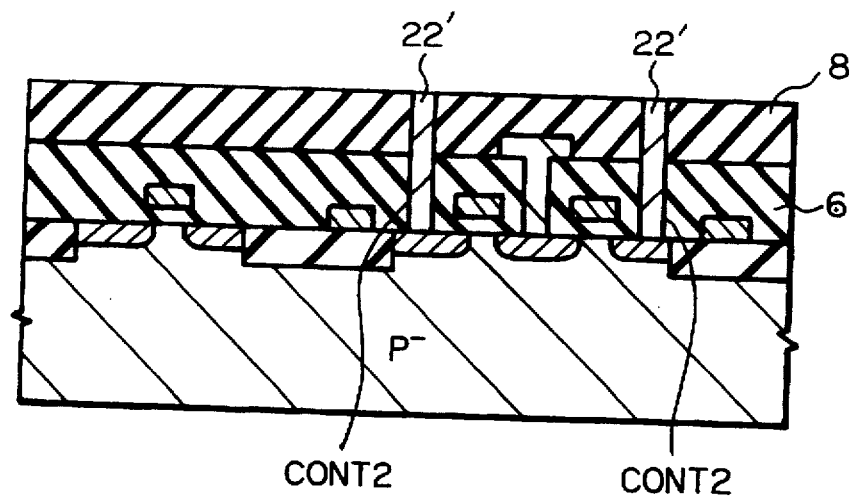

First, referring to FIGS. 14A, 14B and 14C, the same processes as shown in FIGS. 4A, 4B and 4C are carried out. In this case, the insulating layer 8 is made of silicon oxide and etching stopper material thereon.

Figure 14D:
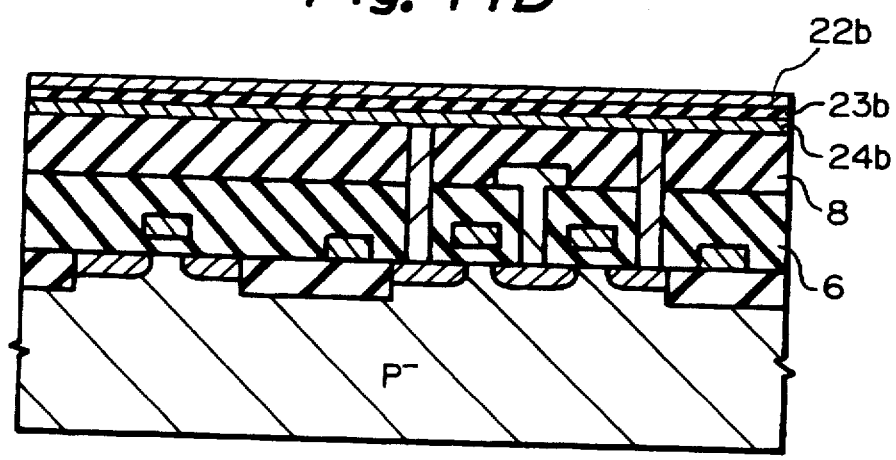

Next, referring to FIG. 14D, a capacitior upper electrode layer 24b made of phosphorus doped polycrystalline silicon is formed by a CVD process. Then, a capacitor insulating layer 23b made of about 100 nm thick silicon nitride is formed by a CVD process, and thereafter, a capacitor lower electrode layer 22b made of about 100 nm thick titanium nitride is formed by a CVD process.

Figure 14E:
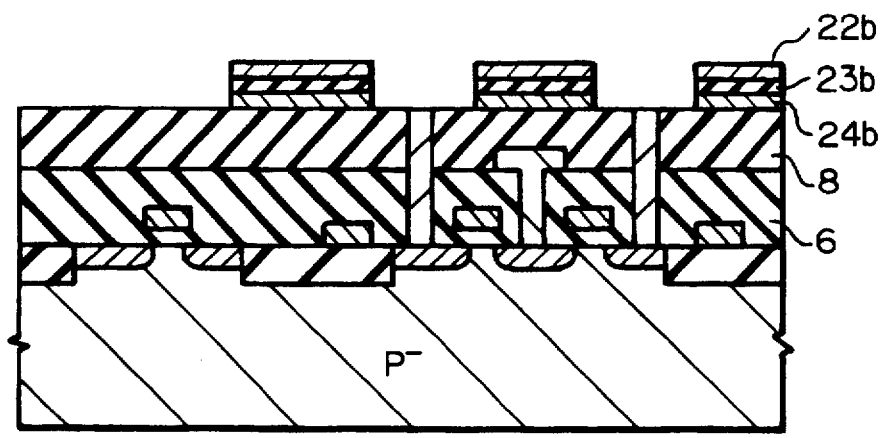

Next, referring to FIG. 14E, the capacitor lower electrode layer 22b, the capacitor insulating layer 23b and the capacitor upper electrode layer 24b are patterned.

Figure 14F:
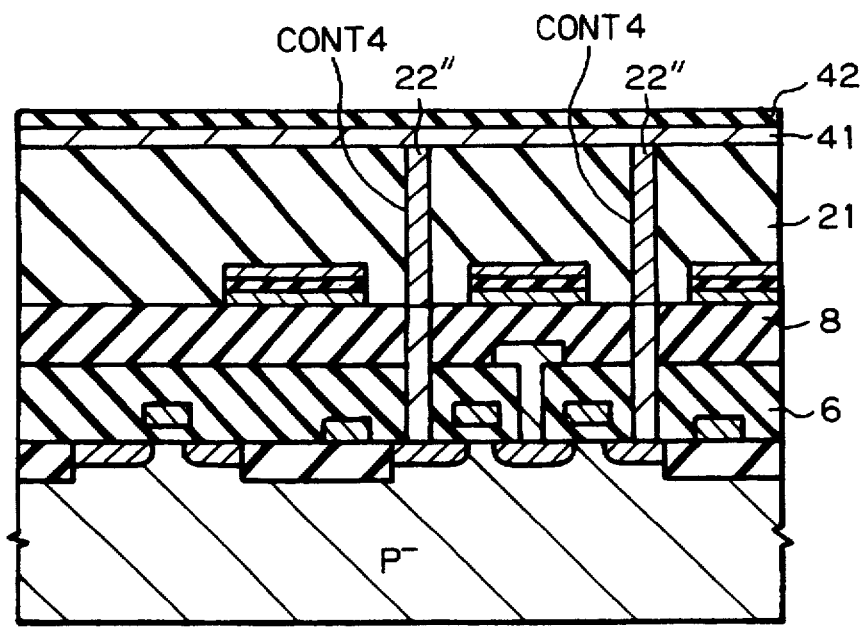

Next, referring to FIG. 14F, in the same way as in FIG. 11D, an about 500 to 1000 nm thick insulating layer 21 made of silicon oxide is formed by a CVD process. Then, contact holes CONT4 are perforated in the insulating layer 21. Then, a phosphorus doped polycrystalline silicon layer 22" is buried in the contact holes CONT4 in the same way as the phosphorus doped polycrystalline silicon layer 22' buried in the contact holes CONT2. Then, an about 100 to 200 nm thick titanium nitride layer 41 is formed thereon, and thereafter, an about 100 nm thick silicon oxide layer 32 for a back-etching process is formed.

Figure 14G:
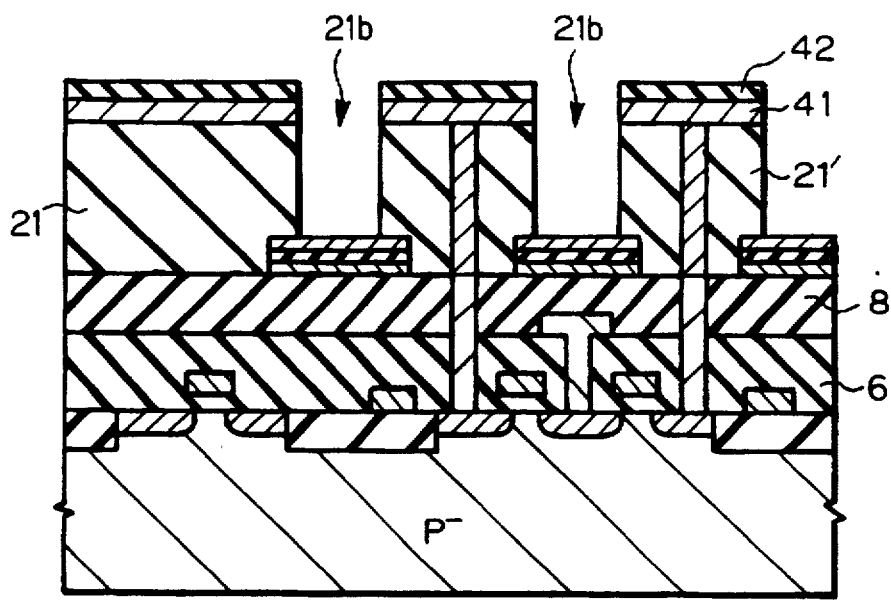

Next, referring to FIG. 14G, in the same way as in FIG. 11E, the silicon oxide layer 42 and the titanium nitride layer 41 are etched by an RIE process with a resist mask (not shown). Subsequently, grooves 21b are perforated in the insulating layer 21 by this RIE process. As a result, insulating islands 21' are formed in the memory cell array X.

Figure 14H:
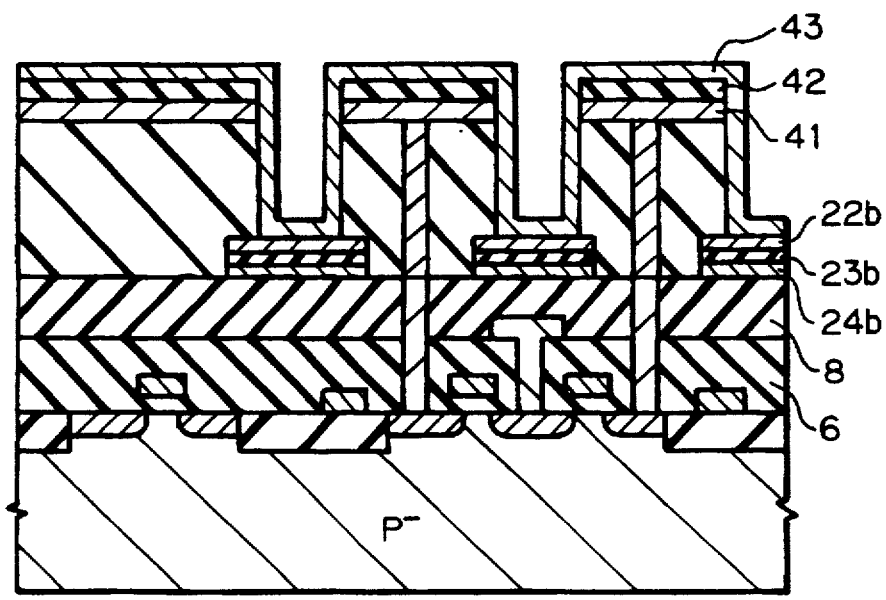
Figure 14:
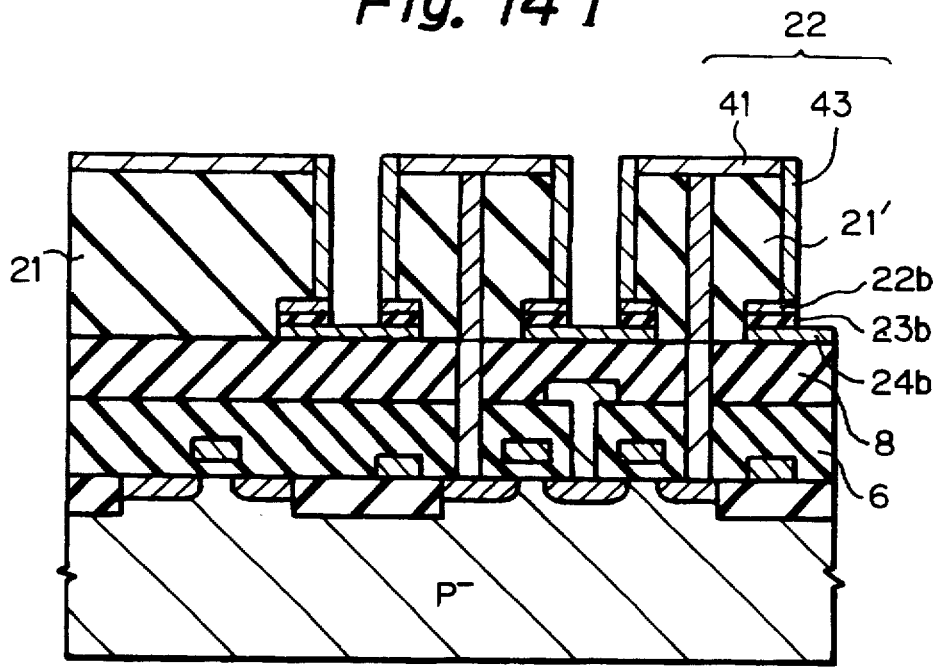
Figure 14:
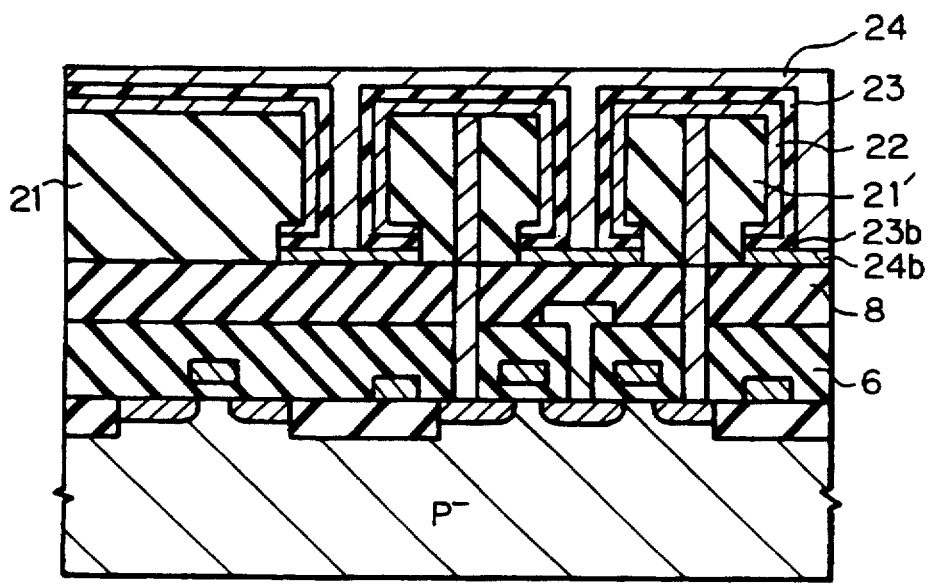

Next, referring to FIG. 14H, in the same way as in FIG. 11F, a titanium nitride layer 43 is again formed. Note that the thickness of the titanium nitride layer 43 is smaller than that of the titanium nitride layer 41. The titanium nitride layer 43 is anisotropically etched back by an RIE process using a mixture gas of HBr and Cl$_2$. As a result, as shown in FIG. 14I, the titanium nitride layer 43 is left on only the sidewalls of the insulating islands 21' of the insulating layer 21. Thus, a capacitor lower electrode layer 22 is constructed by the layers 41 and 43 and is coupled to the capacitor lower electrode layer 22b on the bottom of the grooves of the insulating layer 21. Also, in this case, the capacitor insulating layer 23b is etched with a mask of the capacitor lower electrode layer 22.

Next, referring to FIG. 14J, in the same way as in FIG. 11H, a capacitor insulating layer 23 made of silicon nitride, or ferroelectrics such as tantalum oxide, STO, BST or PZT is formed by a CVD process. Also, a capacitor insulating layer 23 made of silicon nitride, or ferroelectrics such as tantalum oxide, STO or BST or PZT is formed. Then, a capacitor upper electrode layer 24 made of laminated TiN and W is formed by a sputtering process.

Figure 14K:
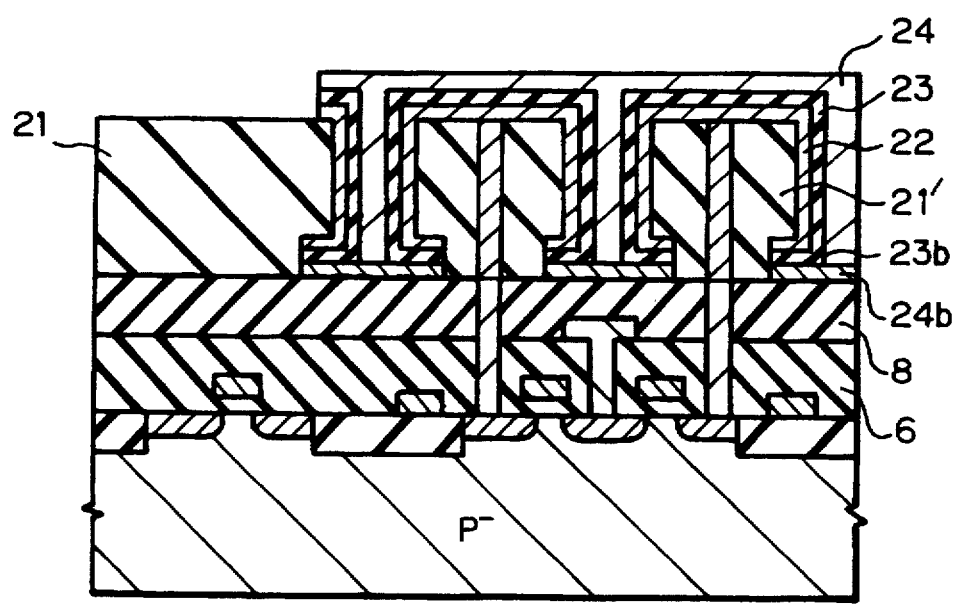

Finally, referring to FIG. 14K, in the same way as in FIG. 11I, the capacitor upper electrode layer 24 and the capacitor insulating layer 23 are patterned. Note that the capacitor upper electrode layer 24b is electrically connected to the capacitor upper electrode layer 24.

Then, an insulating layer 25 and first aluminum wiring layers 26 are formed to complete the device of FIG. 13.

Figure 15:
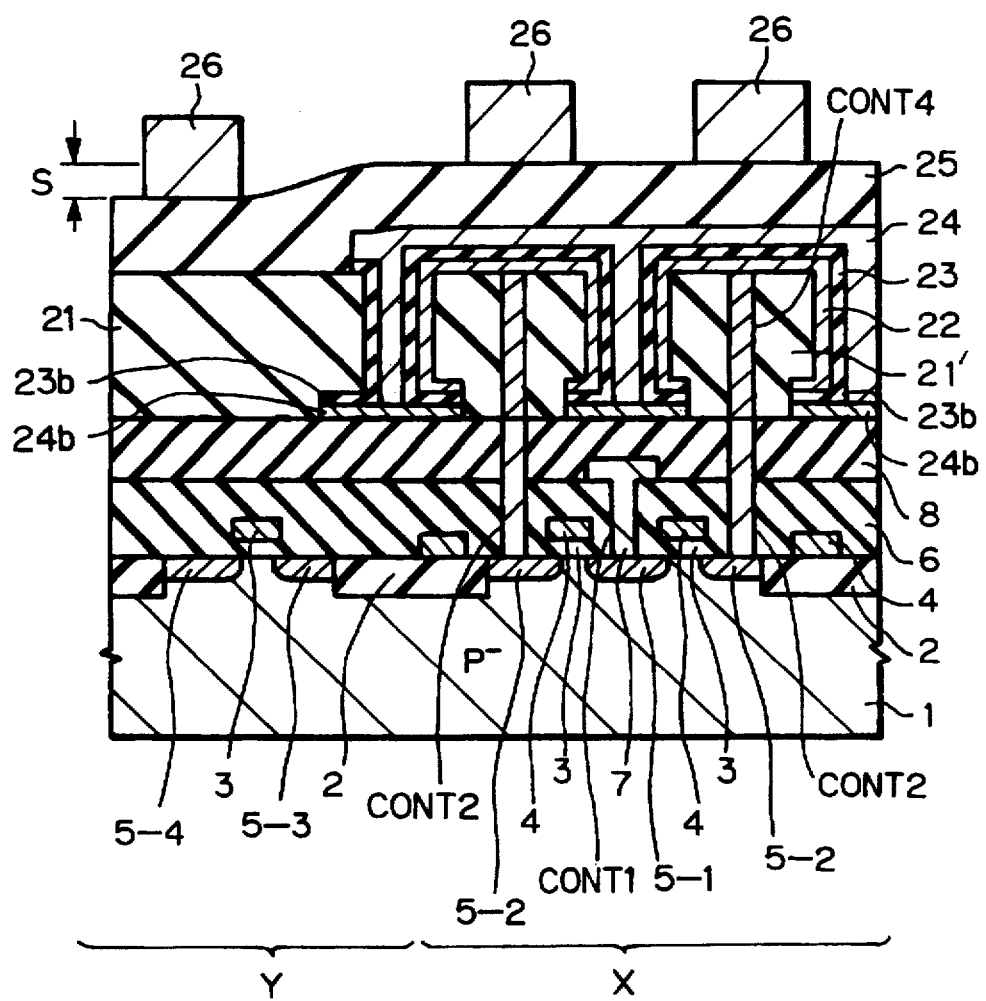
FIG. 15 is a cross-sectional view illustrating a modification of the device of FIG. 13.

In FIG. 15, which is a modification of the device of FIG. 13, the capacitor lower electrode layer 22 on the insulating layer 21 on the peripheral circuit area Y is not provided. As a result, a step S between the memory cell array area X and the peripheral circuit area Y is reduced as compared with the fourth embodiment illustrated in FIG. 13. The manufacture of the device of FIG. 15 is the same as that of FIG. 13 except that an RIE process using a resist pattern is added to remove the capacitor lower electrode 22 on the insulating layer 21 in FIG. 14I.

Although the above-described step S between the memory cell array area and the peripheral circuit area in a prior art 256 Mbit DRAM device is 0.8 to 1.0 µm, this step S in a 256 Mbit DRAM device according to the present invention is less than 0.3 µm.

As explained hereinbefore, according to the present invention, since a step between the memory cell array area and the peripheral circuit area can be reduced, a fine wiring pattern can be arranged around an interface therebetween, to enhance the integration of the device. Also, a highly integrated stacked capacitor can be obtained.

I claim:

1. A method for manufacturing a stacked capacitor type semiconductor memory device comprising the steps of:

forming a first insulating layer made of a first material on a semiconductor substrate;

forming a second insulating layer made of a second material different from said first material on said first insulating layer;

forming a plurality of openings in said second insulating layer;

forming a plurality of first capacitor upper electrode layers on sidewalls within said openings of said second insulating layer;

forming a first capacitor insulating layer on said first capacitor upper electrode layers;

forming a plurality of capacitor lower electrode layers on bottom surfaces within said openings of said second insulating layers and on said first capacitor insulating layer;

forming a plurality of first contact holes in said first capacitor insulating layer;

forming a second capacitor insulating layer on said capacitor lower electrode layers;

forming a second capacitor upper electrode layer on said capacitor insulating layer, said second capacitor upper electrode layer being electrically connected via said first contact holes to said first capacitor upper electrodes.

2. A method as set forth in claim 1, further comprising the steps of:

forming a plurality of impurity doped regions in said semiconductor substrate forming a plurality of second contact holes in said first insulating layer, each of said contact holes leading to one of said impurity doped regions; and forming conductive layers buried in said second contact holes, so that said capacitor lower electrode layers are electrically connected via said second contact holes to said impurity doped regions.

3. A method as set forth in claim 1, further comprising a step of forming a third capacitor upper electrode layer on said second insulating layer, said third capacitor upper electrode layer being electrically connected to said first capacitor upper electrode layer.

4. A method as set forth in claim 1, wherein said second insulator is made thick and a stacked capacitor, comprised of said capacitor lower electrode, said first capacitor insulating layer, said second capacitor insulating layer, said first capacitor upper electrode layer, and said second capacitor upper electrode layer, is buried in said second insulator layer to minimize a vertical step, said step being a relative difference in device thickness of a peripheral circuit area and a memory cell array area, thereby improving integration of said semiconductor memory device.

5. A method as set forth in claim 4, wherein said second insulator has a thickness between 500 and 1000 nm.

6. A method for manufacturing a stacked capacitor type semiconductor memory device comprising the steps of:

forming a first insulating layer made of a first material on a semiconductor substrate;

forming first capacitor upper electrode layers on said first insulating layer;

forming first capacitor insulating layers on said first capacitor upper electrode layers;

forming first capacitor lower electrode layers on said first capacitor insulating layers;

forming a second insulating layer made of a second material different from said first material on on said first capacitor lower electrode layers and said first insulating layer;

forming a groove in said second insulating layer, so that said second insulating layer is divided into a plurality of insulating islands;

forming a plurality of second capacitor lower electrode layers on upper surfaces and sidewalls of said insulating islands, each of said second capacitor lower electrode layers being connected to one of said first capacitor lower electrode layers;

forming a plurality of second capacitor insulating layers each on one of said second capacitor lower electrode layers; and forming a second capacitor upper electrode layer on said capacitor insulating layers, said second capacitor upper electrode layer being connected to said first capacitor upper electrode layers.

7. A method as set forth in claim 6, further comprising the steps of:

forming a plurality of impurity doped regions in said semiconductor substrate forming a plurality of first contact holes in said first insulating layer, each of said first contact holes leading to one of said impurity doped regions; and forming first conductive layers buried in said first contact holes;

forming a plurality of second contact holes in said insulating islands, each of said second contact holes leading to one of said first contact holes; and forming second conductive layers buried in said second contact holes, so that said second capacitor lower electrode layers are electrically connected via said first and second contact holes to said impurity doped regions.

8. A method as set forth in claim 6, whereby said second insulator is made thick and a stacked capacitor, comprising said first capacitor lower electrode layers, said second capacitor lower electrode layers, said first capacitor insulating layers, said second capacitor insulating layers, said first capacitor upper electrode layers, and said second capacitor upper electrode layers, is formed around said insulating islands of said second insulating layer to minimize a vertical step, said vertical step being a relative difference in device thickness of a peripheral circuit area and a memory cell array area, thereby improving integration of said random access device.

9. A method as set forth in claim 8, wherein said second insulator has a thickness between 500 and 1000 nm.

* * * * *